(12) United States Patent
Hwang

(10) Patent No.: US 11,756,599 B2
(45) Date of Patent: Sep. 12, 2023

(54) STORAGE CONTROLLER, STORAGE DEVICE, AND OPERATION METHOD OF STORAGE DEVICE

(71) Applicant: Samsung Electronics Co., Ltd., Suwon-si (KR)

(72) Inventor: Soon Suk Hwang, Ansan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/523,369

(22) Filed: Nov. 10, 2021

(65) Prior Publication Data

US 2022/0189521 A1    Jun. 16, 2022

(30) Foreign Application Priority Data

Dec. 15, 2020    (KR) .................. 10-2020-0175139

(51) Int. Cl.
  *G11C 7/22*    (2006.01)
  *G11C 7/10*    (2006.01)
  *G11C 7/18*    (2006.01)
  *G11C 7/20*    (2006.01)
  *G11C 8/18*    (2006.01)

(52) U.S. Cl.
  CPC ............ *G11C 7/222* (2013.01); *G11C 7/1012* (2013.01); *G11C 7/1069* (2013.01); *G11C 7/1096* (2013.01); *G11C 7/20* (2013.01); *G11C 8/18* (2013.01)

(58) Field of Classification Search
  CPC ..... G11C 7/222; G11C 7/1012; G11C 7/1069; G11C 7/1096; G11C 7/20; G11C 8/18
  See application file for complete search history.

(56) References Cited

U.S. PATENT DOCUMENTS

| 10,114,657 | B2  | 10/2018 | Jenkins et al. |
| 10,262,708 | B2* | 4/2019  | Jeong ................... G11C 29/028 |
| 10,325,633 | B2* | 6/2019  | Lee ....................... G11C 7/1006 |
| 10,346,177 | B2  | 7/2019  | Natu et al. |
| 10,347,305 | B2* | 7/2019  | Chae ...................... G11C 7/106 |
| 10,366,022 | B2  | 7/2019  | Lee et al. |
| 10,402,565 | B2  | 9/2019  | Sarangdhar et al. |

(Continued)

FOREIGN PATENT DOCUMENTS

| KR | 2019-0044887 A | 5/2019 |
| KR | 2020-0052562 A | 5/2020 |

*Primary Examiner* — Tri M Hoang
(74) *Attorney, Agent, or Firm* — Harness, Dickey & Pierce, P.L.C.

(57) ABSTRACT

An operation method of a storage device, which includes a storage controller and a nonvolatile memory device, includes performing first boot-up operation, performing first training on a plurality of data signals such that a detection operation of the first training is repeatedly performed on windows of the data signals, storing offset information generated based on a result of the first training, performing a normal operation based on the result of the first training, performing a second boot-up operation, performing second training on the plurality of data signals based on the offset information generated in the first training such that a detection operation of the second training is repeatedly performed on a left edge section and a right edge section of windows of the data signals, and performing the normal operation based on a result of the second training.

20 Claims, 16 Drawing Sheets

(56) References Cited

U.S. PATENT DOCUMENTS

| | | | |
|---|---|---|---|
| 10,403,375 B2 | 9/2019 | Lee et al. | |
| 10,474,473 B2 | 11/2019 | Rothman et al. | |
| 10,566,075 B2 * | 2/2020 | Kim | G06F 13/16 |
| 10,824,575 B2 * | 11/2020 | Lee | G06F 3/0659 |
| 10,916,276 B2 * | 2/2021 | Yamamoto | G06F 13/4243 |
| 10,991,446 B2 * | 4/2021 | Kim | G06F 13/42 |
| 11,139,010 B2 * | 10/2021 | Park | G11C 7/222 |
| 2010/0082967 A1 * | 4/2010 | Lo | G11C 29/50012 |
| | | | 711/E12.001 |
| 2016/0180898 A1 | 6/2016 | Hwang et al. | |
| 2016/0314002 A1 | 10/2016 | Khatri et al. | |
| 2019/0122745 A1 | 4/2019 | Kim et al. | |
| 2019/0187899 A1 | 6/2019 | Yu et al. | |
| 2020/0143854 A1 | 5/2020 | Kim et al. | |
| 2021/0027817 A1 * | 1/2021 | Chen | G06F 1/12 |
| 2022/0057965 A1 * | 2/2022 | Hwang | G11C 7/1063 |

* cited by examiner

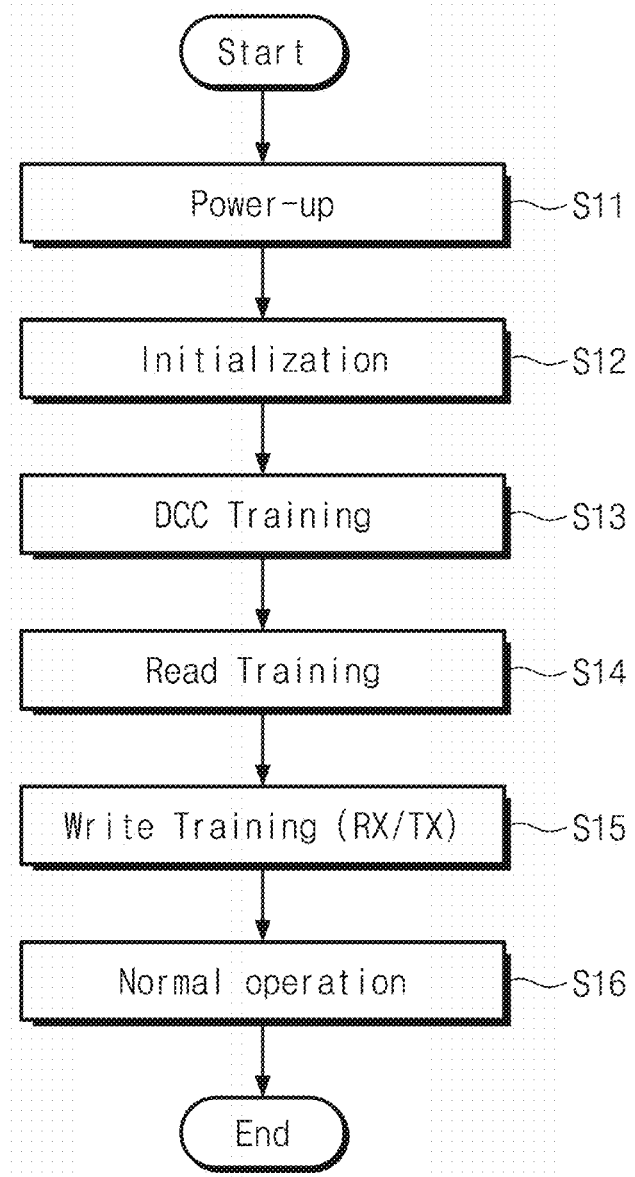

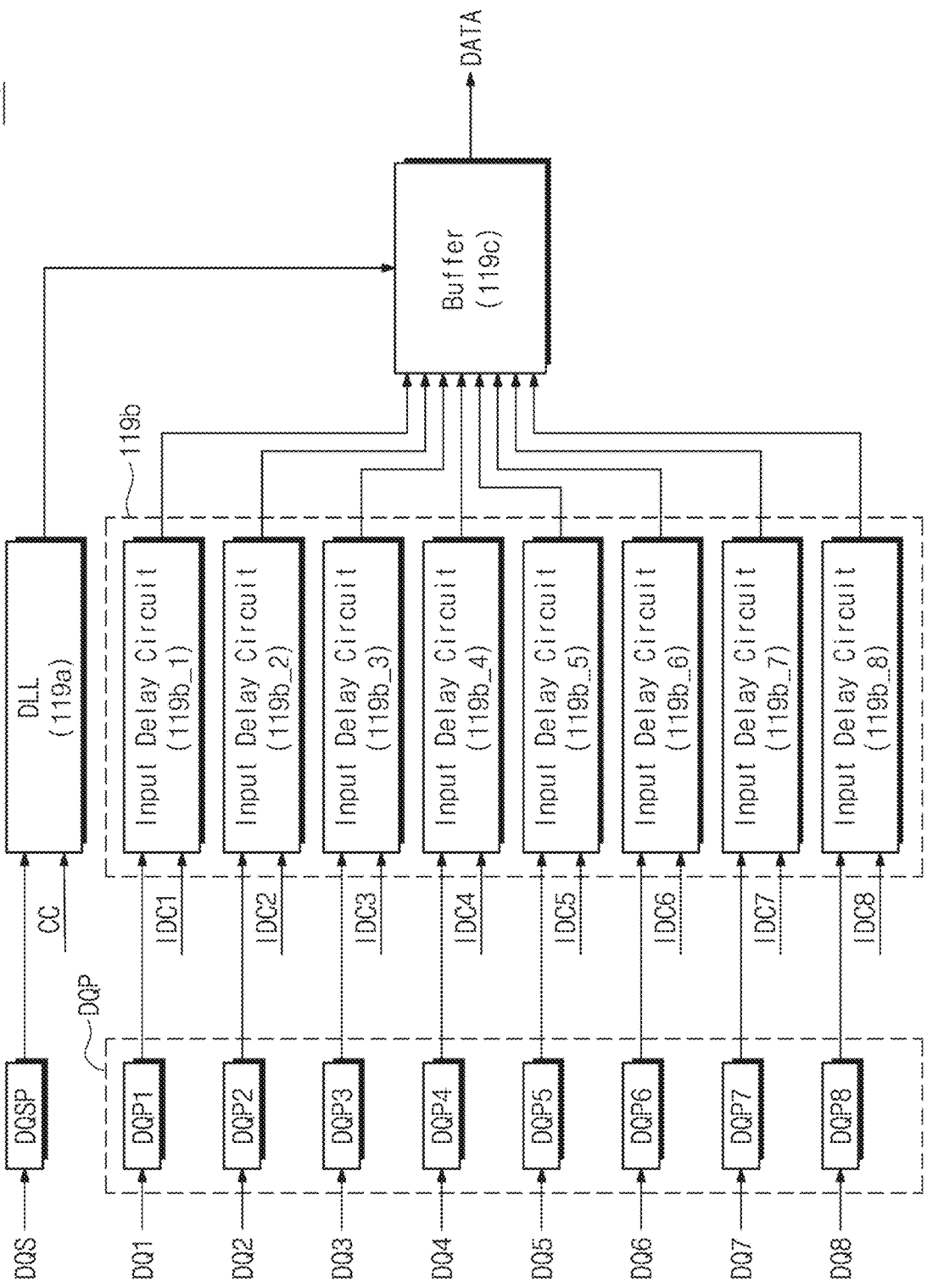

STORAGE CONTROLLER, STORAGE DEVICE, AND OPERATION METHOD OF STORAGE DEVICE

CROSS-REFERENCE TO RELATED APPLICATIONS

This application claims priority under 35 U.S.C. § 119 to Korean Patent Application No. 10-2020-0175139 filed on Dec. 15, 2020, in the Korean Intellectual Property Office, the disclosures of which are incorporated by reference herein in their entireties.

BACKGROUND

Embodiments of the present disclosure described herein relate to a semiconductor memory, and more particularly, relate to a storage controller, a storage device, and an operation method of the storage device.

A semiconductor memory is classified as a volatile memory, in which stored data disappear when a power is interrupted, such as a static random access memory (SRAM) or a dynamic random access memory (DRAM), or a nonvolatile memory, in which stored data are retained even when a power is interrupted, such as a flash memory, a phase change RAM (PRAM), a magnetic RAM (MRAM), a resistive RAM (RRAM), or a ferroelectric RAM (FRAM).

A storage controller and a nonvolatile memory device communicate with each other through data signals. Training may be performed to improve the reliability of data transmission between the storage controller and the nonvolatile memory device through data signals. The training includes aligning transmission or arrival timings of pieces of data sent in parallel through the data signals.

SUMMARY

Embodiments of the present disclosure provide a storage controller with an improved training speed, a storage device, and an operating method of the storage device.

According to at least some example embodiments, an operation method of a storage device which includes a storage controller circuit and a nonvolatile memory device includes performing a first boot-up operation; performing first training on a plurality of data signals such that a detection operation of the first training is repeatedly performed on a whole windows of the data signals; storing offset information generated based on a result of the first training; performing a normal operation based on the result of the first training; performing a second boot-up operation; performing second training on the plurality of data signals based on the offset information generated in the first training such that a detection operation of the second training is repeatedly performed on a left edge section and a right edge section of windows of the data signals; and performing the normal operation based on a result of the second training, wherein the detection operation includes: sending, by the storage controller circuit, a read command and an address to the nonvolatile memory device through the plurality of data signals; receiving, by the storage controller circuit, pattern data from the nonvolatile memory device through the plurality of data signals and a data strobe signal synchronized with the plurality of data signals; and when the pattern data are not matched with given reference data, adjusting, by the storage controller circuit, a delay amount of the data strobe signal.

According to at least some example embodiments, a storage device includes a nonvolatile memory device; and a storage controller circuit connected with the nonvolatile memory device through a plurality of data signals, wherein, the storage controller circuit is configured such that, based on performing a first boot-up operation, the storage controller circuit performs first training on the plurality of data signals and generates offset information based on a result of the first training, wherein, the storage controller circuit is further configured such that, based on performing a second boot-up operation, the storage controller circuit performs second training on the plurality of data signals within a left edge section and a right edge section of windows of the data signals, based on the offset information, and wherein the first boot-up operation is a boot-up operation performed for a first time, and the second boot-up operation is a boot-up operation performed after the first boot-up operation.

According to at least some example embodiments, a storage controller circuit includes a plurality of data input/output pads configured to receive a plurality of data signals; a data strobe pad configured to receive a data strobe signal; and a training circuit, wherein the training circuit is configured such that, based on performance of a first boot-up operation, the training circuit performs first training on the plurality of data signals and generates offset information based on a result of the first training, wherein the training circuit is further configured such that, based on performance of a second boot-up operation, the training circuit performs second training on the plurality of data signals within a left edge section and a right edge section of windows of the data signals based on the offset information, and wherein the first boot-up operation is a boot-up operation performed for the first time, and the second boot-up operations is a boot-up operation performed after the first boot-up operation.

BRIEF DESCRIPTION OF THE FIGURES

The above and other features and advantages of example embodiments of the inventive concepts will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

FIG. 4 is a flowchart illustrating an operation of a storage device of FIG. 1.

FIG. 7 is a block diagram illustrating an NVM interface circuit of FIG. 6 in more detail.

DETAILED DESCRIPTION

Figure 1:
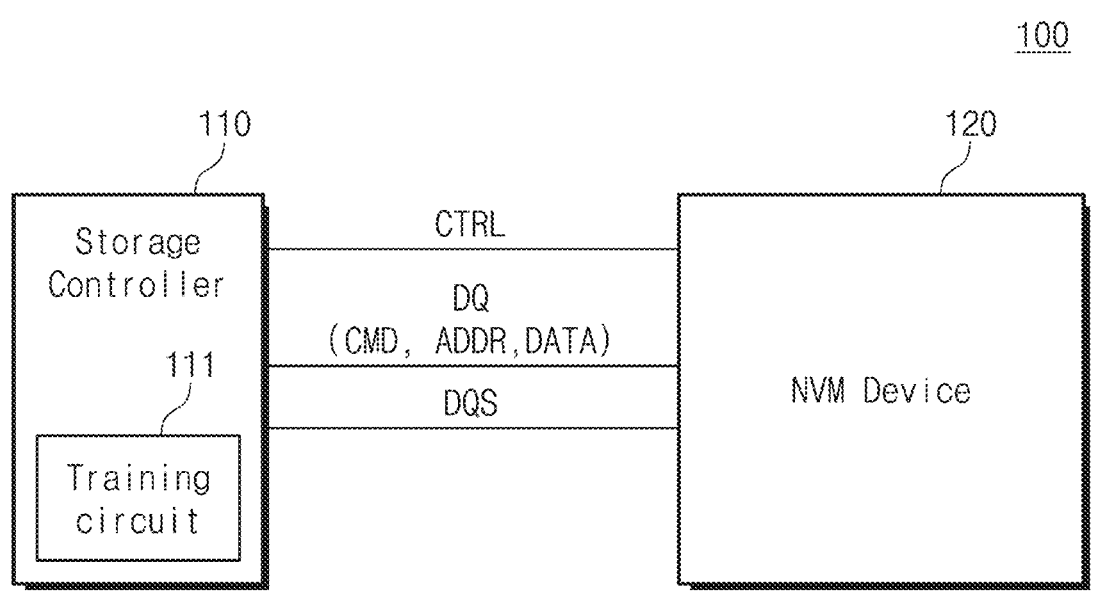
FIG. 1 is a block diagram illustrating a storage device according to example embodiments of the present disclosure.

As is traditional in the field of the inventive concepts, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of example embodiments. Further, the blocks, units and/or modules of example embodiments may be physically combined into more complex blocks, units and/or modules without departing from the scope of example embodiments.

Below, example embodiments of the present disclosure may be described in detail and clearly to such an extent that one skilled in the art easily may carry out the present disclosure.

Here, the term "data training" used in the present disclosure means an operation of searching for and adjusting a center of a window of a data signal DQ. The term "left edge LE" means a closed portion of a left side of a unit interval UI forming the window of the data signal DQ (or a portion thereof corresponding to the first point in time). The term "right edge RE" means a closed portion of a right side of the unit interval UI of the data signal DQ (or a portion thereof corresponding to the last point in time). In addition, the expression "unit interval UI" may be interchangeable with the term "window of a data signal".

FIG. 1 is a block diagram illustrating a storage device according to example embodiments of the present disclosure. Referring to FIG. 1, a storage device 100 may include a storage controller 110 and a nonvolatile memory device 120. In example embodiments, the storage device 100 may be a high-capacity storage medium, which is used in a computing device, such as a solid state drive (SSD) or a memory card.

The storage controller 110 may be configured to control the nonvolatile memory device 120 in response to a request of an external device (e.g., a host, a central processing unit (CPU), or an application processor (AP)) or under control of the external device. For example, to control the nonvolatile memory device 120, the storage controller 110 may exchange various signals with the nonvolatile memory device 120 through control signals CTRL, a plurality of data signals DQ, and a data strobe signal DQS.

In example embodiments, the control signals CTRL, the data strobe signal DQS, and the plurality of data signals DQ may be provided to the nonvolatile memory device 120 through different signal lines and different signal pins. The control signals CTRL and the data strobe signal DQS may be signals for distinguishing signals (e.g., a command CMD, an address ADDR, and data "DATA") provided to the nonvolatile memory device 120 through the plurality of data signals DQ. In example embodiments, each of the data signals DQ represents a signal transmitted/received through a data (DQ) pin, and the data strobe signal DQS represents a signal transmitted/received through a data strobe (DQS) pin.

In response to various signals from the storage controller 110, the nonvolatile memory device 120 may store the data "DATA" received from the storage controller 110 or may send the stored data "DATA" to the storage controller 110. For example, the nonvolatile memory device 120 may determine whether signals provided through the data signals DQ are the command CMD, the address ADDR, or the data "DATA", based on the control signals CTRL. In example embodiments, the control signals CTRL such as a command latch enable signal CLE, an address latch enable signal ALE, a read enable signal /RE, and a write enable signal /WE may be provided to the nonvolatile memory device 120 through control signal lines.

The nonvolatile memory device 120 may be configured to identify (or capture) the data "DATA" provided through the data signals DQ, based on the data strobe signal DQS. The nonvolatile memory device 120 may store the identified data "DATA" based on the received command CMD and the received address ADDR.

In example embodiments, the nonvolatile memory device 120 may include a NAND flash memory. However, the present disclosure is not limited thereto. For example, the nonvolatile memory device 120 may include at least one of volatile or nonvolatile memories such as an SRAM, a DRAM, a synchronous DRAM (SDRAM), a read only memory (ROM), a PROM, an electrically programmable ROM (EPROM), an electrically erasable and programmable ROM (EEPROM), a flash memory, a PRAM, an MRAM, an RRAM, and an FRAM.

The storage controller 110 may be configured to control the nonvolatile memory device 120. For example, the nonvolatile memory device 120 may perform a program, read or erase operation under control of the storage controller 110. Also, the storage controller 110 may perform training with the nonvolatile memory device 120.

The storage controller 110 may perform training with the nonvolatile memory device 120 in a specific situation of the storage device 100 such as boot-up or initialization. For example, the training may be performed after a power is supplied to the storage device 100 or after the storage device 100 returns from a power saving mode to a normal mode. The training may be performed before the storage controller 110 generally controls the nonvolatile memory device 120 (e.g., before the storage controller 110 allows the nonvolatile memory device 120 to perform the program, read, or erase operation).

The storage controller 110 may improve the reliability of data exchange with the nonvolatile memory device 120 through the training. For example, the storage controller 110 may detect a center of a window of the data signal DQ by writing or reading a training pattern in or from the nonvolatile memory device 120 under various conditions. To align the detected window center of the data signal DQ, the storage controller 110 may adjust an offset value of a delay locked loop (DLL) or a phase locked loop (PLL).

The storage controller 110 according to the present disclosure may include a training circuit 111. The training circuit 111 may perform training with the nonvolatile memory device 120. The training circuit 111 may store pieces of information requiring the training or pieces of information (e.g., pieces of offset information to be described later) obtained by the training in a memory. The training circuit 111 may perform training with the nonvolatile memory device 120 by using the pieces of information.

In example embodiments, the training circuit 111 may perform a training (or first training) operation when a booting operation is performed for the first time. The training circuit 111 may generate pieces of offset information through the first training operation and may store the pieces of offset information in the memory. The training circuit 111 may perform a fast training (or second training) operation when there is performed a booting operation different from the booting operation performed for the first time.

For example, the first training operation may indicate a training operation that does not use pieces of offset information and performs a detection operation on the whole of the unit interval UI. The second training operation may indicate a training operation that performs a detection operation or a detection step on a portion of the unit interval UI based on pieces of offset information generated in the first training operation.

The training circuit 111 may perform the second training operation based on pieces of offset information, thus reducing a boot-up time. An operation of the storage controller 110 according to the present disclosure will be described in more detail with reference to the following drawings.

Figure 2:
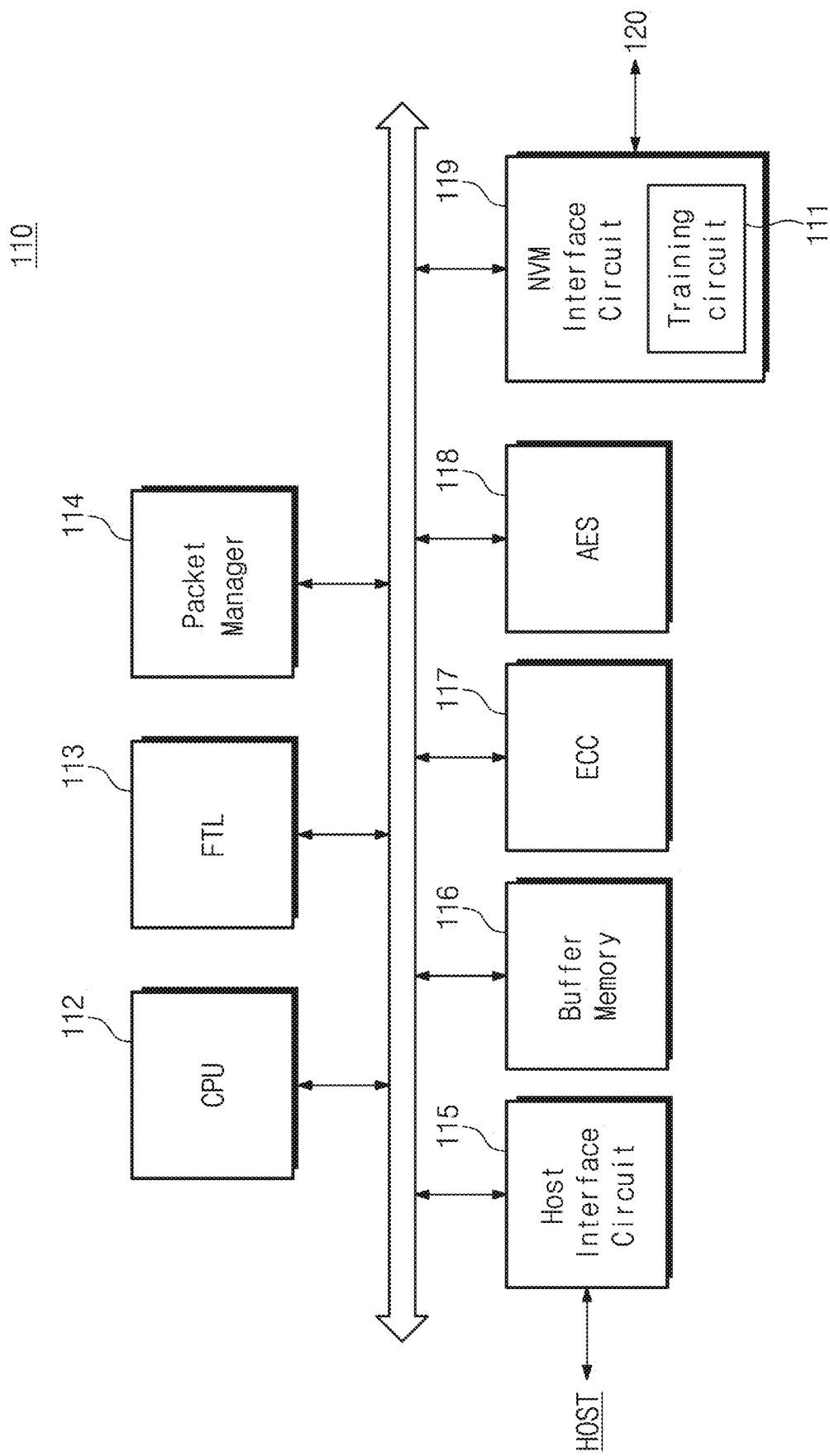
FIG. 2 is a block diagram illustrating a storage controller of FIG. 1.

FIG. 2 is a block diagram illustrating a storage controller of FIG. 1. Referring to FIGS. 1 and 2, the storage controller 110 may include a central processing unit (CPU) 112, a host interface circuit 115, and an NVM interface circuit 119. The storage controller 110 may further include a flash translation layer (hereinafter referred to as an "FTL") 113, a packet manager 114, a buffer memory 116, an error correction code (ECC) engine 117, and an advanced encryption standard (AES) engine 118. The storage controller 110 may further include a working memory (not illustrated) onto which the FTL 113 is loaded, and as the CPU 112 executes the flash translation layer 113, data write and read operations of the nonvolatile memory device 120 may be controlled.

According to at least some example embodiments, any or all of the FTL 113, packet manager 114, error correction code ECC engine 117, and AES engine 118 of the storage controller 110 may be embodied by processing circuitry such as hardware including logic circuits; a hardware/software combination executing software; or a combination thereof. For example, the processing circuitry more specifically may include, but is not limited to, one or more of a central processing unit (CPU), a processor core, an arithmetic logic unit (ALU), a digital signal processor, a microprocessor, a microcomputer, a field programmable gate array (FPGA), a programmable logic unit, a microprocessor, an application-specific integrated circuit (ASIC), etc. Accordingly, the FTL 113, packet manager 114, error correction code ECC engine 117, AES engine 118, and storage controller 110 may also be referred to, in the present specification, as the FTL circuit 113, packet manager circuit 114, error correction code ECC engine circuit 117, AES engine circuit 118, and storage controller circuit 110.

In example embodiments, the host interface circuit 115 may be based on at least one of various interfaces such as a double data rate (DDR) interface, a low-power DDR (LPDDR), a universal serial bus (USB) interface, a multi-media card (MMC) interface, a peripheral component interconnection (PCI) interface, a PCI-express (PCI-e) interface, an advanced technology attachment (ATA) interface, a serial-ATA (SATA) interface, a parallel-ATA (PATA) interface, a small computer small interface (SCSI) interface, an enhanced small disk interface (ESDI), an integrated drive electronics (IDE) interface, a mobile industry processor interface (MIPI), a nonvolatile memory-express (NVM-e) interface, and a universal flash storage (UFS) interface.

The host interface circuit 115 may exchange packets with a host (not illustrated). A packet transmitted from the host to the host interface circuit 115 may include a command or data to be written in the nonvolatile memory device 120, and a packet transmitted from the host interface circuit 115 to the host may include a response to the command or data read from the nonvolatile memory device 120. The NVM interface circuit 119 may transmit data to be written in the nonvolatile memory device 120 to the nonvolatile memory device 120 or may receive data read from the nonvolatile memory device 120. The NVM interface circuit 119 may be implemented to comply with the standard such as Toggle or ONFI (Open NAND Flash Interface).

The FTL 113 may perform various functions such as address mapping, wear-leveling, and garbage collection. The address mapping refers to an operation of translating a logical address received from the host into a physical address to be used to actually store data in the nonvolatile memory device 120. The wear-leveling may refer to a technology for reducing or preventing excessive degradation of a specific block by allowing blocks of the nonvolatile memory device 120 to be used evenly and may be implemented, for example, through a firmware technology for balancing erase counts of physical blocks. The garbage collection may refer to a technology for securing an available capacity of the nonvolatile memory device 120 by copying valid data of an existing block to a new block and erasing the existing block.

The packet manager 114 may generate a packet according to a protocol of an interface negotiated with the host or may parse various kinds of information from a packet received from the host. The buffer memory 116 may temporarily store data to be stored in the nonvolatile memory device 120 or data read from the nonvolatile memory device 120. The buffer memory 116 may be a component provided within the storage controller 110, but the buffer memory 116 can be located outside the storage controller 110.

The ECC engine 117 may perform an error detection and correction function on read data read out from the nonvolatile memory device 120. In more detail, the ECC engine 117 may generate parity bits from write data to be written in the nonvolatile memory device 120, and the parity bits thus generated may be stored in the nonvolatile memory device 120 together with the write data. When data are read from the nonvolatile memory device 120, the ECC engine 117 may correct an error of the read data by using parity bits read from the nonvolatile memory device 120 together with the read data and may output error-corrected read data.

The AES engine 118 may perform at least one of an encryption operation and a decryption operation on data input to the storage controller 110 by using a symmetric-key algorithm.

In example embodiments, the NVM interface circuit 119 may include the training circuit 111. The training circuit 111 may perform training with the nonvolatile memory device 120. The training circuit 111 may store pieces of information requiring the training or pieces of information (e.g., pieces of offset information to be described later) obtained by the training in a memory. In example embodiments, the memory may be implemented with a serial NOR flash memory, but example embodiments are not limited thereto. Pieces of offset information may be stored in an electronic fuse (eFuse), an EEPROM, a mask ROM, a serial PROM, a flash memory, a one-time programmable (OTP) memory, or a serial NOR flash memory.

The training circuit 111 according to example embodiments of the present disclosure may reduce or minimize the number of times of access to the nonvolatile memory device 120 when performing the second training operation. For write training, the training circuit 111 may write pattern data in the nonvolatile memory device 120 and may read the written pattern data therefrom. For read training, the training circuit 111 may read pattern data stored in in the nonvolatile memory device 120. The training circuit 111 may compare the read pattern data with given reference data and may determine a center position of a window depending on a result of the comparison.

That is, the training circuit 111 may detect a left edge LE and a right edge RE of a window of the data signal DQ based on the comparison result. The training circuit 111 may determine the center of the window of the data signal DQ based on the detected edges LE and RE. The detection step (or detection operation) may indicate an operation where there are combined an access operation to the nonvolatile memory device 120 for training and an operation of comparing the read pattern data and the reference data.

In general, for training, the storage controller 110 may perform a lot of detection steps during at least one unit interval UI. For example, in some example embodiments where a length of the unit interval UI is 1000 ps and a time required for one detection step is 10 ps, the detection step may be performed at least 100 times to detect a center of at least one unit interval 1 UI or a window of a data signal. When the above training scheme is applied, the open timing of the storage device 100 may inevitably increase in a situation where a large number of nonvolatile memory devices are trained.

The storage controller 110 may reduce the number of detection steps for detecting the center or edge of the data signal DQ by using pieces of offset information generated as a result of the first training operation. For example, the storage controller 110 may perform detection steps only on a left edge section and a right edge section. The storage controller 110 may omit detection steps in the remaining sections other than the left edge section and the right edge section.

A storage controller according to example embodiments of the present disclosure may omit or skip a relatively large number of detection steps. Accordingly, it may be possible to reduce a time necessary for training upon booting the storage device 100 including a plurality of nonvolatile memory devices. Accordingly, because the open timing is short in booting, the storage device 100 of the present disclosure may be quickly accessed.

Figure 3:
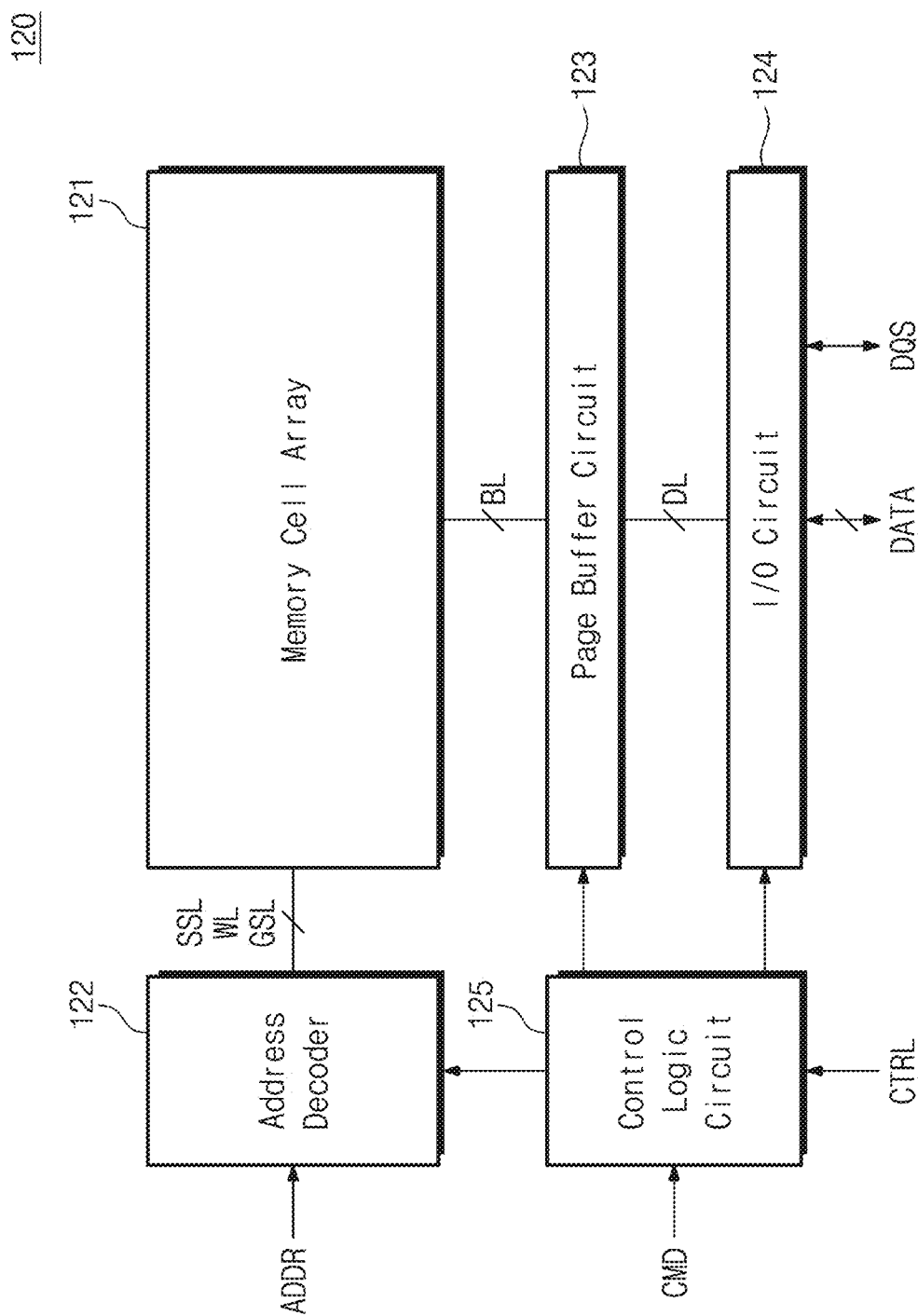
FIG. 3 is a block diagram illustrating a nonvolatile memory device of FIG. 1.

FIG. 3 is a block diagram illustrating a nonvolatile memory device of FIG. 1. According to at least some example embodiments, the memory device may include processing circuitry such as hardware including logic circuits; a hardware/software combination executing software; or a combination thereof. For example, the processing circuitry more specifically may include, but is not limited to, one or more of a central processing unit (CPU), a processor core, an arithmetic logic unit (ALU), a digital signal processor, a microprocessor, a microcomputer, a field programmable gate array (FPGA), a programmable logic unit, a microprocessor, an application-specific integrated circuit (ASIC), etc.

Referring to FIGS. 1 and 3, the nonvolatile memory device 120 may include a memory cell array 121, an address decoder 122, a page buffer circuit 123, an input/output circuit 124, and a control logic circuit 125. According to at least some example embodiments, the address decoder 122 may be embodied by one or more circuits or circuitry. Accordingly, the address decoder 122 may also be referred to in the present specification as the address decoder circuit 122.

In example embodiments, for brevity of drawing and for convenience of description, the command CMD, the address ADDR, and the data "DATA" are separately illustrated, but the present disclosure is not limited thereto. For example, the command CMD, the address ADDR, and the data "DATA" may be received from the storage controller 110 through the data signals DQ and may be distinguished from each other based on the control signals CTRL (e.g., CLE, ALE, /RE, and/WE).

The memory cell array 121 may include a plurality of memory blocks. The plurality of memory blocks may include a plurality of cell strings, the plurality of cell strings may be respectively connected with bit lines BL, and each of the plurality of cell strings may include a plurality of cell transistors connected in series. The plurality of cell transistors may be connected with word lines WL, string selection lines SSL, or ground selection lines GSL.

The address decoder 122 may be connected with the memory cell array 121 through the string selection lines SSL, the word lines WL, and the ground selection lines GSL. The address decoder 122 may receive the address ADDR from the storage controller 110. The address decoder 122 may decode the address ADDR and may control voltages of the string selection lines SSL, the word lines WL, and the ground selection lines GSL based on a decoding result.

The page buffer circuit 123 is connected with the memory cell array 121 through the bit lines BL. The page buffer circuit 123 may be configured to temporarily store data to be stored in the memory cell array 121 or data read from the memory cell array 121.

The input/output circuit 124 may provide the data "DATA" received from the storage controller 110 to the page buffer circuit 123. The input/output circuit 124 may provide the data "DATA" received from the page buffer circuit 123 to the storage controller 110.

The control logic circuit 125 may receive the command CMD from the storage controller 110 and may control various components of the nonvolatile memory device 120 such that an operation corresponding to the received command CMD is performed.

FIG. 4 is a flowchart illustrating an operation of a storage device of FIG. 1. An initialization operation or a boot-up operation of the storage device 100 will be described with reference to FIG. 4. Referring to FIGS. 1 and 4, in operation S11, the storage device 100 may be powered up. In operation S12, the storage device 100 may perform the initialization operation. The storage controller 110 and the nonvolatile memory device 120 may perform the initialization operation depending on a given manner. During the initialization operation, the storage controller 110 may supply a power supply voltage to the nonvolatile memory device 120 and may perform various initial setting operations, and the storage controller 110 may read necessary information from the nonvolatile memory device 120 or may set necessary information.

The initialization operation may include a ZQ calibration operation. The storage device 100 may perform the ZQ calibration operation. The ZQ calibration operation may refer to an operation of adjusting the strength of output drivers connected with the data signal DQ or any other signal lines or an operation of setting an on-die termination (ODT) value, so as to provide the high integrity of data.

In operation S13, the storage device 100 may perform a duty correction circuit (DCC) training operation. The nonvolatile memory device 120 may output data through the data signal DQ in synchronization with a rising edge and a falling edge of the data strobe signal DQS. Windows of the data signal DQ may correspond to a logical high section and a logical low section of the data strobe signal DQS. Because the data strobe signal DQS is generated based on the read enable signal /RE, a window of the data signal DQ may be determined depending on a ratio of a logical high section and a logical low section of the read enable signal /RE.

Duty mismatch may occur. That is, because lengths of the logical high section and the logical low section of the read enable signal /RE are different, data windows of the data signal DQ may vary. Accordingly, a valid data window may be secured by performing the DCC training operation such that a duty of a clock signal such as the read enable signal /RE is corrected.

In operation S14, the storage device 100 may perform a read training operation. For example, the storage controller 110 may adjust setting values of the nonvolatile memory device 120 and the storage controller 110 such that the signal integrity or data-eye of data read from the nonvolatile memory device 120 is improved or, alternatively, optimized. In example embodiments, the read training operation may be independently performed on a plurality of data lines DQ1 to DQn.

In operation S15, the storage device 100 may perform a write training operation. The write training operation may include TX side write training and RX side write training. The TX side write training may be omitted. For example, the storage controller 110 may transmit data to the nonvolatile memory device 120 and may adjust setting values of the storage controller 110 and the nonvolatile memory device 120 such that the signal integrity or data-eye of the transmitted data is improved or, alternatively, optimized. In example embodiments, the write training operation may be independently performed on the plurality of data lines DQ1 to DQn. After the initialization and training operations are performed in operation S11 to operation S15, in operation S16, the storage device 100 may perform a normal operation based on a training result.

The training operations performed in operation S13, operation S14, and operation S15 may represent a DQ training operation. Training operations to be described with reference to the following drawings may be applied to operation S13, operation S14, and operation S15.

In example embodiments, the training operations performed in operation S13, operation S14, and operation S15 mutually make reference to results of the training operations. For example, the integrity of data may be secured by performing a read operation based on the read training result performed in operation S14 when the write training operation is performed in operation S15.

Figure 5A:
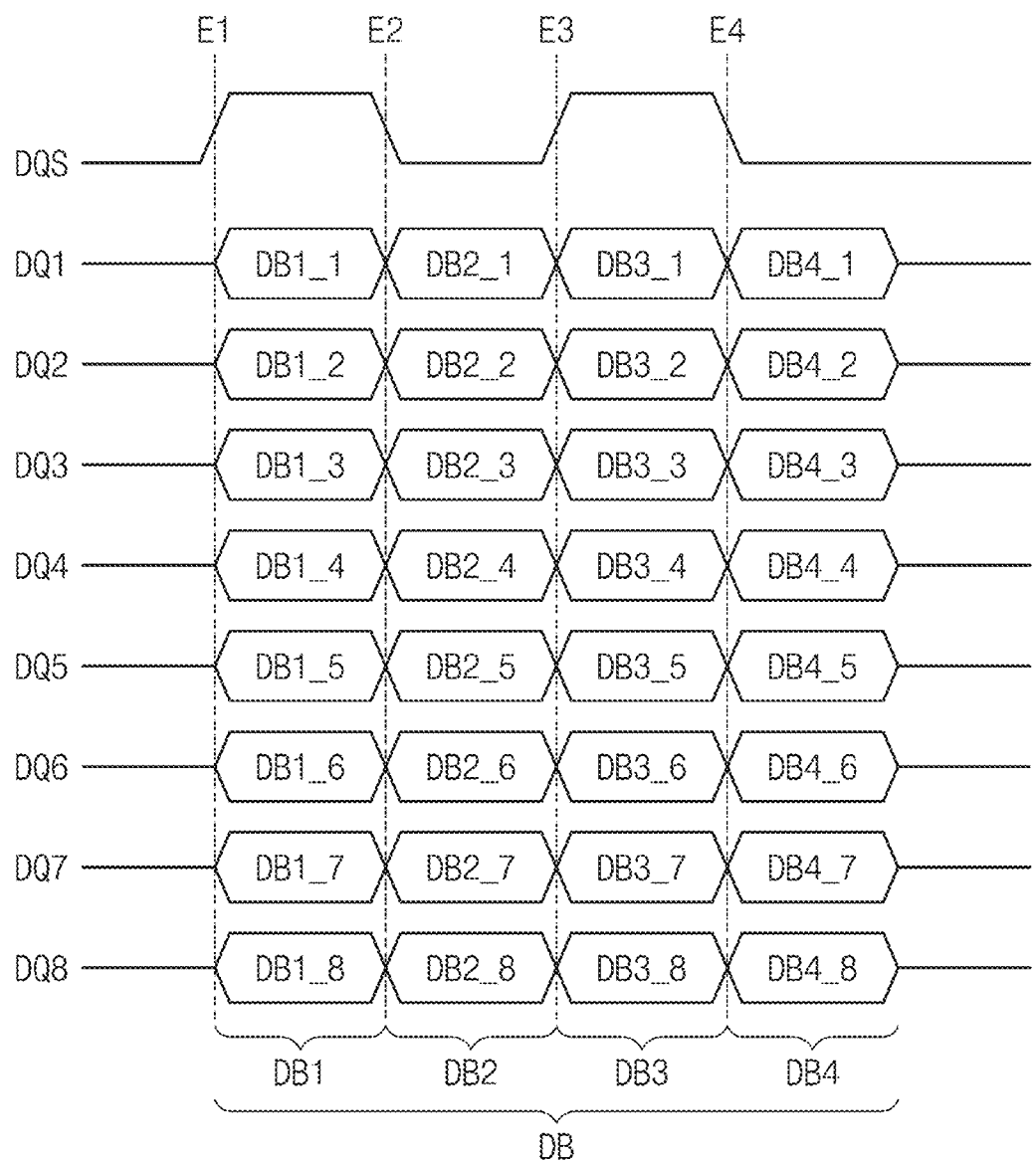
FIG. 5A illustrates an example where a nonvolatile memory device of FIG. 1 outputs data bits.

FIG. 5A illustrates an example where a nonvolatile memory device of FIG. 1 outputs data bits. Referring to FIGS. 1 and 5A, the nonvolatile memory device 120 may output pattern data or data bits DB1 to DB4 (e.g., DB) through data signals DQ1 to DQ8 in response to a read command. The storage controller 110 may output the read enable signal /RE toggling between to a high level and a low level periodically. In response to the read enable signal /RE, the nonvolatile memory device 120 may generate the data strobe signal DQS toggling between to the high level and the low level periodically.

The nonvolatile memory device 120 may output the data bits DB in synchronization with the data strobe signal DQS. The nonvolatile memory device 120 may output the data bits DB in synchronization with rising edges and falling edges of the data strobe signal DQS. The data bits DB may be aligned with the data strobe signal DQS, and thus, the data bits DB and the data strobe signal DQS may be mutually aligned.

Figure 5B:
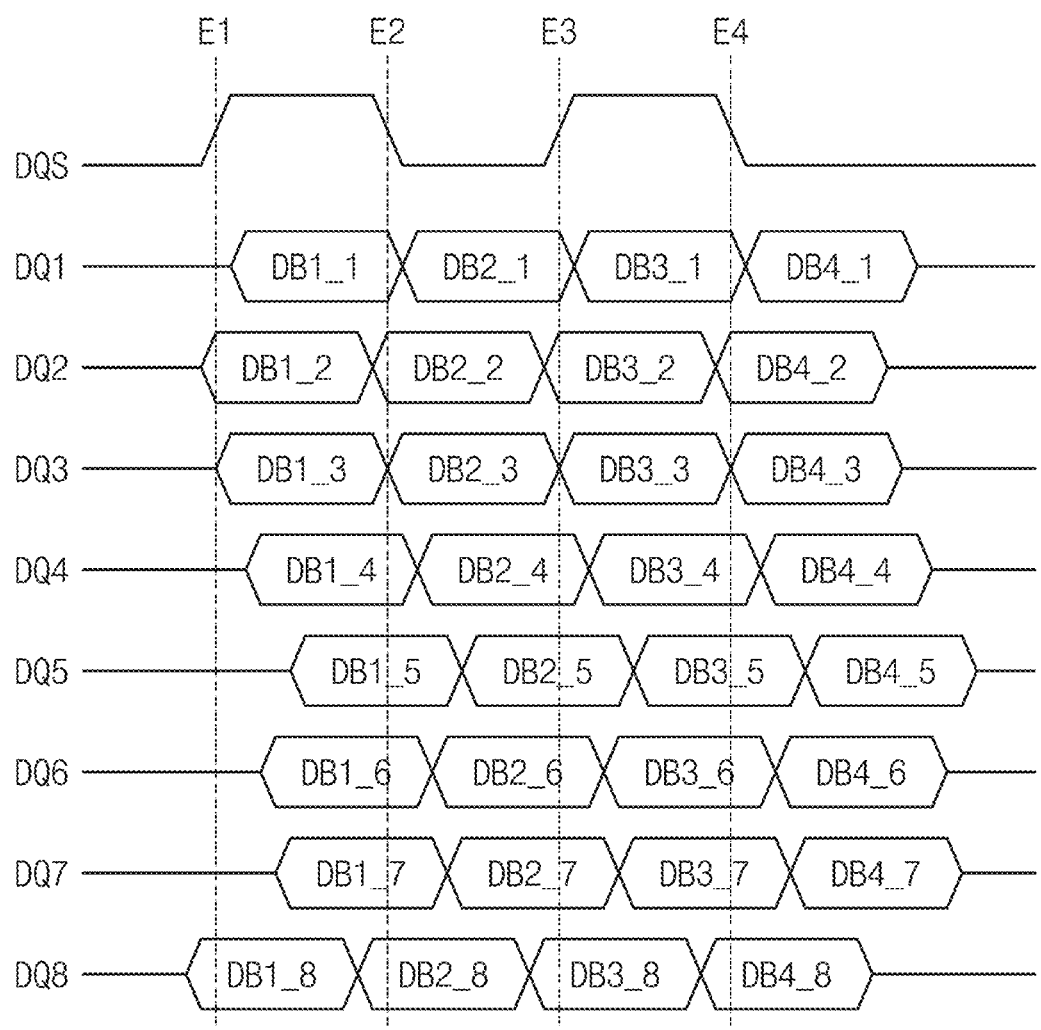
FIG. 5B illustrates an example where data bits of FIG. 5A are received by a storage controller of FIG. 1.

FIG. 5B illustrates an example where data bits of FIG. 5A are received by a storage controller of FIG. 1. In example embodiments, timings of the data bits DB being the pattern data received by the storage controller 110 may be different from timings (refer to FIG. 5A) of the data bits DB sent from the nonvolatile memory device 120, due to various environment factors such as parasitic resistance, parasitic capacitance, parasitic inductance, temperature, and humidity.

Referring to FIGS. 1 and 5B, timings of data bits DB1_1 to DB4_1 sent through the first data signal DQ1 may be delayed with respect to timings of the edges of the data strobe signal DQS. Timings of data bits DB1_2 to DB4_2 sent through the second data signal DQ2 may lead the timings of the edges of the data strobe signal DQS. Timings of data bits DB1_3 to DB4_3 sent through the third data signal DQ3 may be matched with the timings of the edges of the data strobe signal DQS.

Timings of data bits DB1_4 to DB4_4 sent through the fourth data signal DQ4 may be delayed with respect to the timings of the edges of the data strobe signal DQS. Timings of data bits DB1_5 to DB4_5 sent through the fifth data signal DQ5 may be delayed with respect to the timings of the edges of the data strobe signal DQS. Timings of data bits DB1_6 to DB4_6 sent through the sixth data signal DQ6 may be delayed with respect to the timings of the edges of the data strobe signal DQS.

Timings of data bits DB1_7 to DB4_7 sent through the seventh data signal DQ7 may be delayed with respect to the timings of the edges of the data strobe signal DQS. Timings of data bits DB1_8 to DB4_8 sent through the eighth data signal DQ8 may lead the timings of the edges of the data strobe signal DQS. As such, the timings of the data bits sent through the plurality of data signals DQ1 to DQ8 may not be matched with each other.

To compensate for differences between the timings illustrated in FIGS. 5A and 5B, the storage controller 110 may adjust timings (or sampling timings) at which the data bits DB (or the pattern data) are latched.

Figure 6:
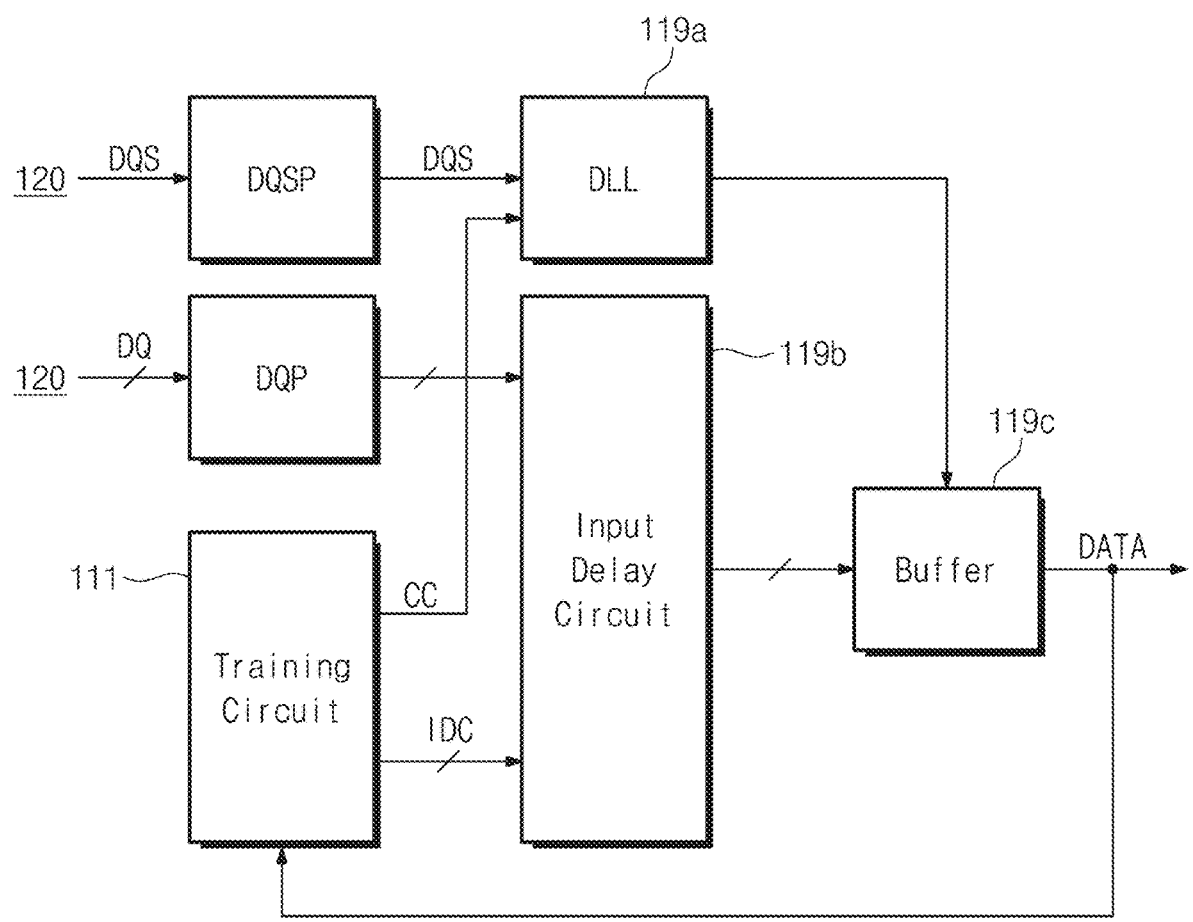
FIG. 6 is a block diagram illustrating an NVM interface circuit of a storage controller of FIG. 2.

FIG. 6 is a block diagram illustrating an NVM interface circuit of a storage controller of FIG. 2. The NVM interface circuit 119 may include a plurality of data input/output pads DQP, a data strobe pad DQSP, the training circuit 111, a delay locked loop (DLL) 119a, a plurality of input delay circuits 119b, and a buffer 119c. According to at least some example embodiments, DLL 119a may be embodied by one or more circuits or circuitry. Accordingly, the DLL 119a may also be referred to in the present specification as the DLL circuit 119a.

The data strobe pad DQSP may receive the data strobe signal DQS from the nonvolatile memory device 120. However, the present disclosure is not limited thereto. For example, the data strobe pad DQSP may output the data strobe signal DQS to the nonvolatile memory device 120, and components for outputting the data strobe signal DQS may be provided in the NVM interface circuit 119. The data strobe pad DQSP may transfer the received data strobe signal DQS to the delay locked loop 119a.

The plurality of data input/output pads DQP may receive the plurality of data signals DQ from the nonvolatile memory device 120. However, the present disclosure is not limited thereto. For example, the data input/output pads DQP1 to DQP8 (refer to FIG. 7) may output the data signals DQ1 to DQ8 to the nonvolatile memory device 120, and components for outputting the data signals DQ1 to DQ8 may be provided in the NVM interface circuit 119. The plurality of data input/output pads DQP may transfer the data bits DB being the pattern data received through the plurality of data signals DQ to the input delay circuits 119b. As described with reference to FIG. 5B, the plurality of data signals DQ1 to DQ8 may have different delays due to a noise or a difference of delay characteristics. Accordingly, it may be necessary to align the data strobe signal DQS and the plurality of data signals DQ1 to DQ8 through the training operation.

The training circuit 111 may receive the data "DATA" from the buffer 119c. The training circuit 111 may output a clock control signal CC to the delay locked loop 119a. The training circuit 111 may output an input data control signal IDC to the plurality of input delay circuits 119b.

In example embodiments, the training circuit 111 may be configured to perform the training operation. The training circuit 111 may adjust a sampling timing of each of the data signals DQ1 to DQ8 provided from the nonvolatile memory device 120 to the center thereof, through the read training operation. An operation where the training circuit 111 detects the center of each of the data signals DQ1 to DQ8 may be first performed to adjust the sampling timing of the data signals DQ1 to DQ8 to the center thereof. The training circuit 111 may detect the left edge LE and the right edge RE of each of the data signals DQ1 to DQ8 and may detect the center of each of the data signals DQ1 to DQ8 based on a detection result.

The training circuit 111 may control the delay locked loop 119a through the clock control signal CC. For example, the training circuit 111 may repeat a detection step while shifting the data strobe signal DQS as much as a tick time. The training circuit 111 may control the clock control signal CC such that a delay amount of the data strobe signal DQS is adjusted. As such, the training circuit 111 may detect a left edge offset and a right edge offset of each of the data signals DQ1 to DQ8.

The training circuit 111 may adjust a timing or a delay amount of the data signal DQ through the input data control signal IDC. The training circuit 111 may detect a center of the window of the data signal DQ based on the left edge offset and the right edge offset of each of the data signals DQ1 to DQ8. The training circuit 111 may align the data signals DQ based on the left edge offsets and the right edge offsets of the data signals DQ1 to DQ8 thus detected. The training circuit 111 may generate the input data control signal IDC based on the left edge offset and the right edge offset.

The delay locked loop 119a may receive the data strobe signal DQS from the data strobe pad DQSP. The delay locked loop 119a may receive the clock control signal CC from the training circuit 111. The delay locked loop 119a may delay and output the data strobe signal DQS based on the clock control signal CC. The delay locked loop 119a may provide the buffer 119c with the delayed data strobe signal DQS. For example, the delay locked loop 119a may include a plurality of delay cells for adjusting a timing of the data strobe signal DQS. By activating a plurality of delay cells in response to the clock control signal CC, the delay locked loop 119a may adjust a timing of the data strobe signal DQS. However, the present disclosure is not limited thereto. For example, the storage controller 110 may include a phase locked loop instead of the delay locked loop 119a The plurality of input delay circuits 119b may receive the plurality of data bits DB from the plurality of data input/output pads DQP. The plurality of input delay circuits 119b may receive a plurality of input data control signals IDC from the training circuit 111. The plurality of input delay circuits 119b may delay and output the received data bits DB in response to the plurality of input data control signals IDC.

For example, each of the plurality of input delay circuits 119b may include a plurality of delay cells for adjusting a timing of the corresponding data signal. By activating the plurality of delay cells in response to the plurality of input data control signals IDC, the plurality of input delay circuits 119b may individually control timings at which the data signals DQ1 to DQ8 are respectively sampled (or may individually control delay amounts of the data signals DQ1 to DQ8). The plurality of input delay circuits 119b may provide the buffer 119c with the plurality of data signals DQ1 to DQ8 thus delayed.

The buffer 119c may receive a clock or the delayed data strobe signal from the delay locked loop 119a. The buffer 119c may receive the plurality of data signals DQ1 to DQ8 from the plurality of input delay circuits 119b. The buffer 119c may store a plurality of data bits received through the plurality of data signals DQ1 to DQ8 as the data "DATA" and may output the data "DATA". The buffer 119c may provide the data "DATA" to the training circuit 111.

For example, in the training operation, the data "DATA" transferred from input delay circuits 119b_1 to 119b_8 (refer to FIG. 7) may be stored in the buffer 119c and may then be transferred to the training circuit 111. In a normal operation where the training operation is not performed, the data "DATA" stored in the buffer 119c may be transferred to the buffer memory 116.

FIG. 7 is a block diagram illustrating an NVM interface circuit of FIG. 6 in more detail. Referring to FIGS. 3 and 4, the plurality of data input/output pads DQP may include the first to eighth data input/output pads DQP1 to DQP8. The plurality of input delay circuits 119b may include the first to eighth input delay circuits 119b_1 to 119b_8. The plurality of data signals DQ may include the first to eighth data signals DQ1 to DQ8. The plurality of input data control signals IDC may include first to eighth input data control signals IDC1 to IDC8.

The plurality of input delay circuits 119b_1 to 119b_8 are respectively connected with the plurality of data input/output pads DQP1 to DQP8. For example, the first input delay circuit 119b_1 may be connected with the first data input/output pad DQP1, the second input delay circuit 119b_2 may be connected with the second data input/output pad DQP2, the third input delay circuit 119b_3 may be connected with the third data input/output pad DQP3, and the fourth input delay circuit 119b_4 may be connected with the fourth data input/output pad DQP4. As in the above description, the remaining input delay circuits 119b_5 to 119b_8 may be connected with the corresponding data input/output pads DQP5 to DQP8, and thus, additional description will be omitted to avoid redundancy.

The input delay circuits 119b_1 to 119b_8 may receive the input data control signals IDC1 to IDC8, respectively. The input delay circuits 119b_1 to 119b_8 may individually control timings (or delay amounts) of data signals in response to the input data control signals IDC1 to IDC8. For example, the first input delay circuit 119b_1 may adjust a timing to transmit a data signal DQ (e.g., a delay amount of the data signal DQ) in response to the first input data control signal IDC1. As in the above description, the remaining input delay circuits 119b_2 to 119b_8 may adjust timings of the corresponding data signals in response to the corresponding input data control signals IDC2 to IDC8, and thus, additional description will be omitted to avoid redundancy.

Figure 8A:
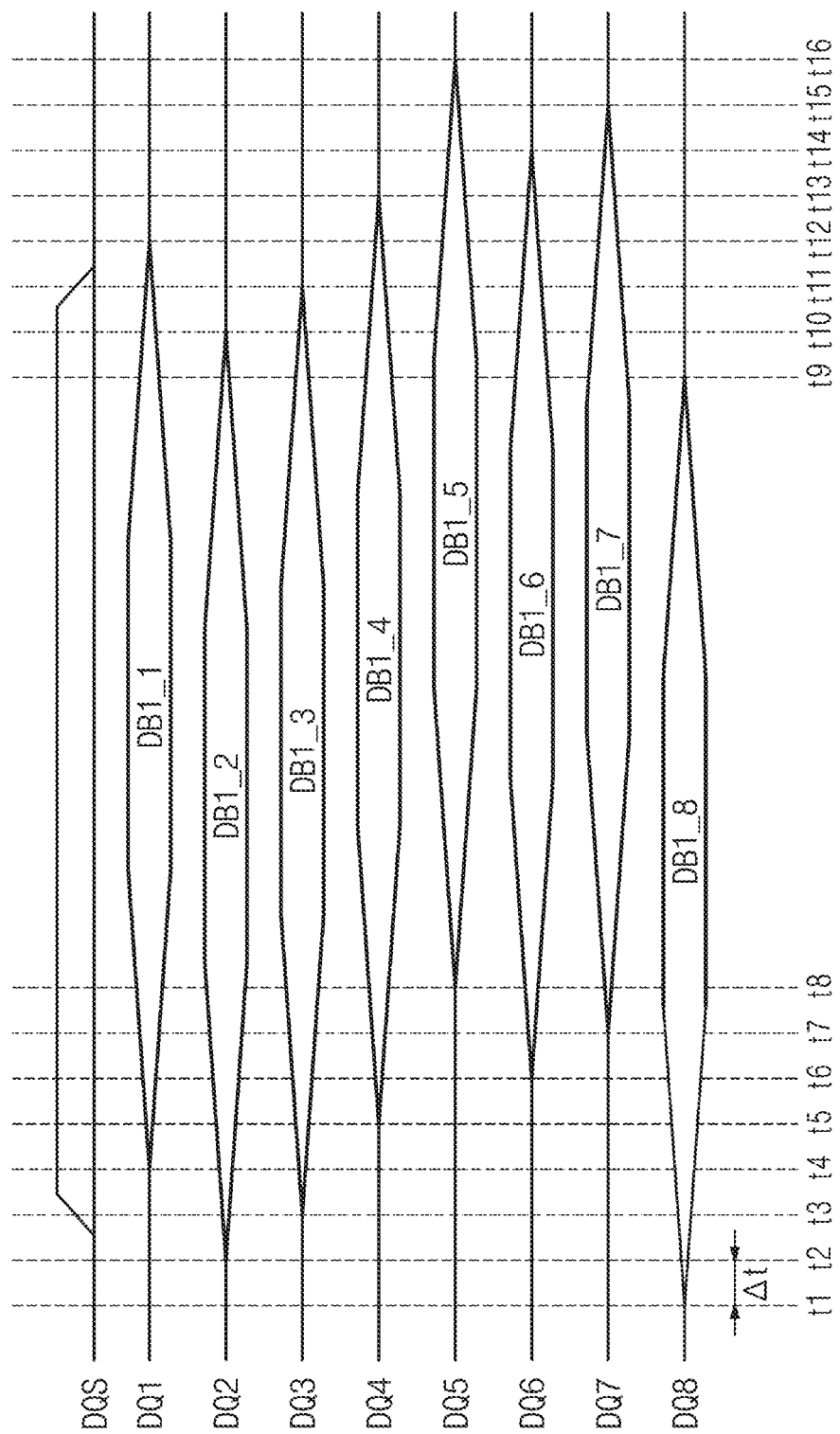
FIGS. 8A and 8B are diagrams illustrating offset information.
Figure 8B:

FIGS. 8A and 8B are diagrams illustrating offset information. Referring to FIGS. 1, 8A, and 8B, timings of the plurality of data signals DQ1 to DQ8 may not be aligned with each other. Accordingly, offset information OI including a left edge offset and a right edge offset associated with each of the plurality of data signals DQ1 to DQ8 may be required. The left edge offset may represent a difference between a left edge of the data strobe signal DQS and a left edge of the data signal DQ, and the right edge offset may represent a difference between a right edge of the data strobe signal DQS and a right edge of the data signal DQ.

For brevity of drawing, only the first data bits DB1 are illustrated, and the remaining data bits DB2 to DB4 are omitted. It is assumed that the left edge of the data strobe signal DQS is formed at a third time t3 and the right edge thereof is formed at an eleventh time t11. In FIG. 8a, sections between the first to sixteenth times t1 to 16 may correspond to a tick time (in FIG. 8B, marked by Δt). For example, the tick time may be a minimum unit or a delay amount of the data strobe signal DQS or the data signal DQ by the training circuit 111. Alternatively, the tick time may be a minimum unit by which the data strobe signal DQS or the data signal DQ is shifted by the training circuit 111.

For example, a left edge of the bit DB1_1 received through the first data signal DQ1 may be formed at the fourth time t4. A timing when the bit DB1_1 is received through the first data signal DQ1 may be delayed with respect to an edge timing of the data strobe signal DQS. A left edge offset LO1 of the first data signal DQ1 may correspond to a difference between the third time t3 and the fourth time t4. That is, the left edge offset LO1 of the first data signal DQ1 may be +Δt.

A left edge of the bit DB1_2 received through the second data signal DQ2 may be formed at the second time t2. A timing when the bit DB1_2 is received through the second data signal DQ2 may lead the edge timing of the data strobe signal DQS. A left edge offset LO2 of the second data signal DQ2 may correspond to a difference between the third time t3 and the second time t2. That is, the left edge offset LO2 of the second data signal DQ2 may be −Δt.

A left edge of the bit DB1_3 received through the third data signal DQ3 may be formed at the third time t3. A timing when the bit DB1_3 is received through the third data signal DQ3 may be matched with the edge timing of the data strobe signal DQS. A left edge offset LO3 of the bit DB1_3 received through the third data signal DQ3 may correspond to a difference between the third time t3 and the third time t3. That is, the left edge offset LO3 of the third data signal DQ3 may be "0".

A left edge of the bit DB1_4 received through the fourth data signal DQ4 may be formed at the fifth time t5. A timing when the bit DB1_4 is received through the fourth data signal DQ4 may be delayed with respect to the edge timing of the data strobe signal DQS. A left edge offset LO4 of the bit DB1_4 received through the fourth data signal DQ4 may correspond to a difference between the third time t3 and the fifth time t5. That is, the left edge offset LO4 of the bit DB1_4 received through the fourth data signal DQ4 may be +2Δt.

As in the above description, left edge offsets of the remaining data signals DQ5 to DQ8 may be detected. Because a left edge of the fifth data signal DQ5 is formed at the eighth time t8, a left edge offset LO5 of the fifth data signal DQ5 may be +5Δt. Because a left edge of the sixth data signal DQ6 is formed at the sixth time t6, a left edge offset LO6 of the sixth data signal DQ6 may be +3Δt. Because a left edge of the seventh data signal DQ7 is formed at the seventh time t7, a left edge offset LO7 of the seventh data signal DQ7 may be +4Δt. Because a left edge of the eighth data signal DQ8 is formed at the first time t1, a left edge offset LO8 of the eighth data signal DQ8 may be −2Δt.

A right edge of the bit DB1_1 received through the first data signal DQ1 may be formed at the twelfth time t12. A timing when the bit DB1_1 is received through the first data signal DQ1 may be delayed with respect to an edge timing of the data strobe signal DQS. A right edge offset RO1 of the first data signal DQ1 may correspond to a difference between the eleventh time t11 and the twelfth time t12. That is, the right edge offset RO1 of the first data signal DQ1 may be +Δt.

As in the above description, right edge offsets of the remaining data signals DQ2 to DQ8 may be detected. Because a right edge of the second data signal DQ2 is formed at the tenth time t10, a right edge offset RO2 of the second data signal DQ2 may be −Δt. Because a right edge of the third data signal DQ3 is formed at the eleventh time t11, a right edge offset RO3 of the third data signal DQ3 may be "0". Because a right edge of the fourth data signal DQ4 is formed at the thirteenth time t13, a right edge offset LO4 of the fourth data signal DQ4 may be +2Δt. Because a right edge of the fifth data signal DQ5 is formed at the sixteenth time t16, a right edge offset RO5 of the fifth data signal DQ5 may be +5Δt. Because a right edge of the sixth data signal DQ6 is formed at the fourteenth time t14, a right edge offset RO6 of the sixth data signal DQ6 may be +3Δt. Because a right edge of the seventh data signal DQ7 is formed at the fifteenth time t15, a right edge offset RO7 of the seventh data signal DQ7 may be +4Δt. Because a right edge of the eighth data signal DQ8 is formed at the ninth time t9, a right edge offset RO8 of the eighth data signal DQ8 may be −2Δt.

The offset information OI may include the first to eighth left edge offsets LO1 to LO8 and the first to eighth right edge offsets RO1 to RO8. In the first training operation, the training circuit 111 may generate the offset information OI based on a first training result. As described above, the training circuit 111 may generate the offset information OI based on the first to eighth left edge offsets LO1 to LO8 and the first to eighth right edge offsets RO1 to RO8. The training circuit 111 may store the offset information OI in a memory; when performing the second training operation, the training circuit 111 may load the offset information OI from the memory and may perform the second training operation based on the loaded offset information OI.

Figure 9:
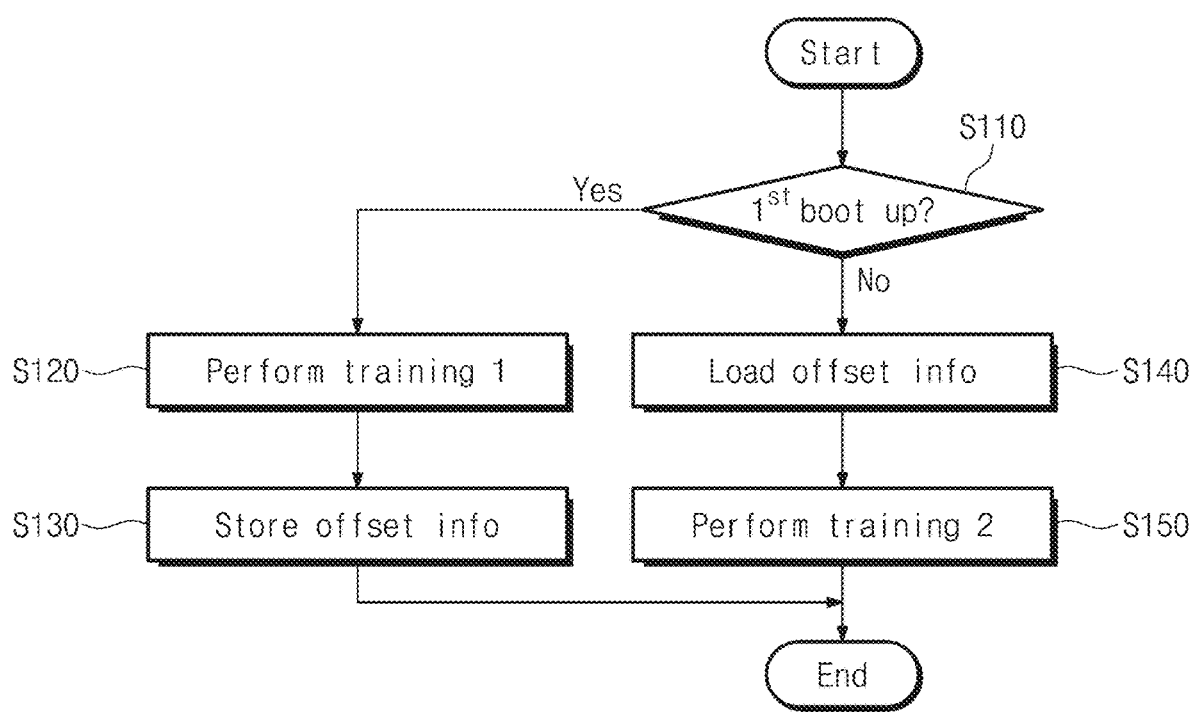
FIG. 9 is a flowchart illustrating an operation of a storage controller of FIG. 1.

FIG. 9 is a flowchart illustrating an operation of a storage controller of FIG. 1. Referring to FIGS. 1 and 9, in operation S110, the storage controller 110 may determine whether a current boot-up operation is the first boot-up operation. For example, the storage controller 110 may determine whether offset information stored through a previous booting operation exists. When it is determined that the current boot-up operation is the first boot-up operation, operation S120 is performed; when it is determined that the current boot-up operation is not the first boot-up operation, operation S140 is performed.

In operation S120, the storage controller 110 may perform training for the first time or may perform the first training operation. For example, the storage controller 110 may perform the first training operation on the data signals DQ1 to DQ8. The storage controller 110 may repeat the detection operation on the whole unit interval while shifting the data strobe signal DQS as much as the tick time.

In operation S130, the storage controller 110 may store a result of the first training operation in a memory as offset information. For example, the storage controller 110 may store the offset information including a left edge offset and a right edge offset associated with each of the plurality of data signals DQ1 to DQ8 in the memory.

In operation S140, the storage controller 110 may load the offset information from the memory. In example embodiments where the current boot-up operation is not the first boot-up operation, the storage controller 110 may load offset information stored in the first boot-up operation from the memory.

In operation S150, the storage controller 110 may perform fast training or the second training operation based on the loaded offset information. For example, the storage controller 110 may set left edge sections and right edge sections of the data signals DQ1 to DQ8 based on left edge offsets and right edge offsets of the plurality of data signals DQ1 to DQ8 included in the offset information. The storage controller 110 may perform the detection operation only on a left edge section and a right edge section without performing the detection operation on the whole unit interval. The second training operation will be described in more detail with reference to the following drawings.

Figure 10:
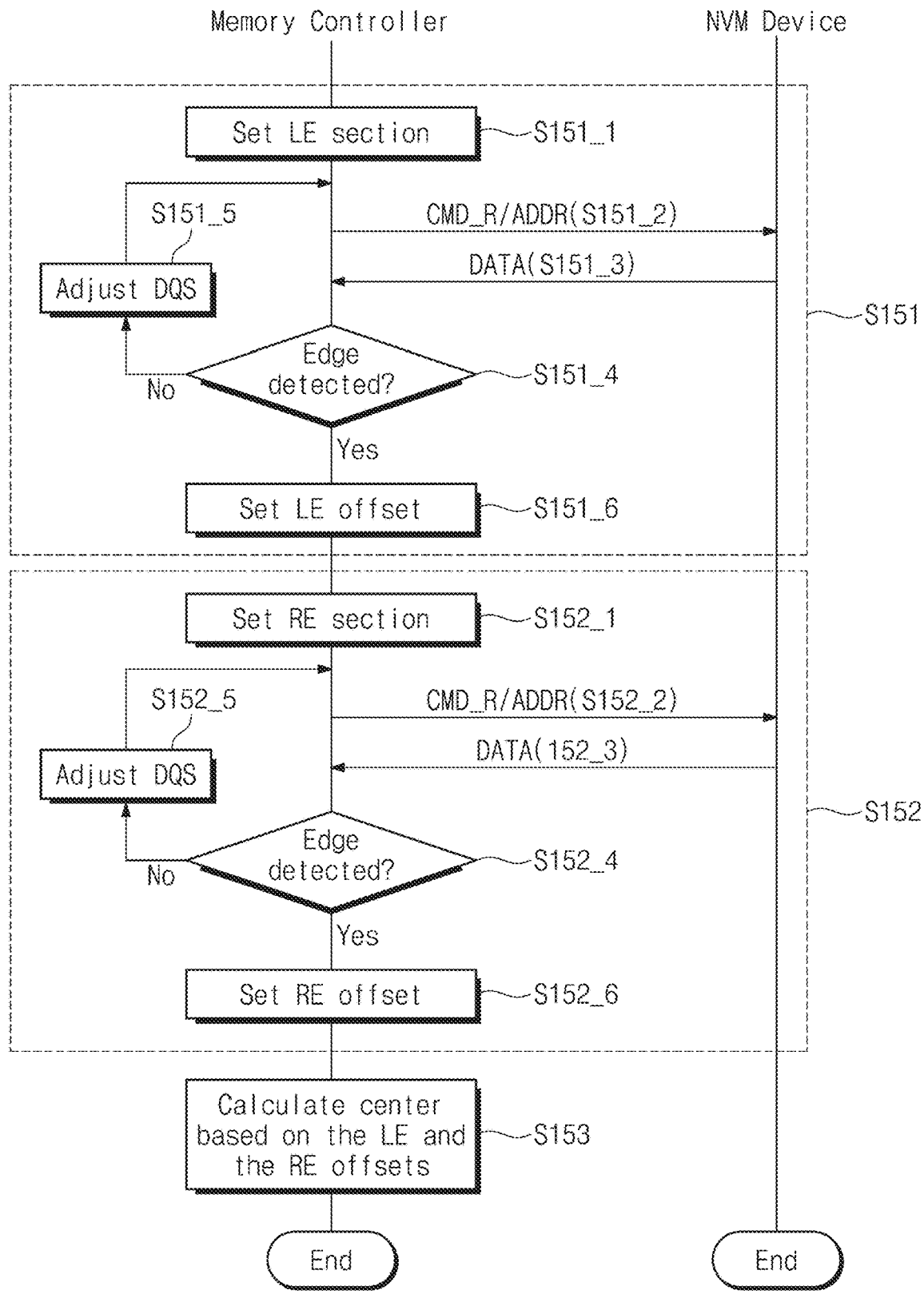
FIG. 10 is a flowchart illustrating a second training operation according to example embodiments of the present disclosure.

FIG. 10 is a flowchart illustrating a second training operation according to example embodiments of the present disclosure. Referring to FIGS. 1 and 10, in operation S151, the storage controller 110 may perform a left edge (LE) detection operation. In operation S152, the storage controller 110 may perform a right edge (RE) detection operation. In operation S153, the storage controller 110 may calculate a center of a window of the data signal DQ based on a left edge (LE) offset and a right edge (RE) offset.

Looking at operation S151 in detail, in operation S151_1, the storage controller 110 may set a left edge (LE) section. For example, the storage controller 110 may set the left edge (LE) section of the unit interval UI of the data signal DQ based on the offset information. The storage controller 110 may set, as the left edge section, a plurality of tick intervals before and after the left edge (LE) offset of the offset information.

In example embodiments, the storage controller 110 may set a delay amount of the data strobe signal DQS to a point different from a start point in the first training operation. That is, the storage controller 110 may set the start point of the left edge section as a start point of a detection step.

In operation S151_2, the storage controller 110 may send a read command CMD_R and the address ADDR to the nonvolatile memory device 120. In example embodiments, the read command CMD_R may be a first set (e.g., 62h) of a read DQ training command, and the address ADDR may be a logical unit number (LUN) address, data invert information Invert mask, a first pattern, and a second pattern.

In operation S151_3, the nonvolatile memory device 120 may provide pattern data "DATA" to the storage controller 110 in response to the read command CMD_R and the address ADDR.

In operation S151_4, the storage controller 110 may determine whether a rising edge of the data strobe signal DQS corresponds to the left edge LE. For example, the storage controller 110 may determine whether the pattern data "DATA" received from the nonvolatile memory device 120 are matched with reference data (e.g., the first pattern and the second pattern) or the data sent to the nonvolatile memory device 120. The storage controller 110 may determine whether the rising edge of the data strobe signal DQS corresponds to the left edge LE of the data signal DQ, based on a determination result.

When the rising edge of the data strobe signal DQS does not correspond to the left edge LE of the data signal DQ, operation S151_5 is performed. In operation S151_5, the storage controller 110 may adjust a delay amount of the data strobe signal DQS. For example, the storage controller 110 may shift the data strobe signal DQS as much as the tick time. Afterwards, the storage controller 110 may repeat operation S151_2 to operation S151_4. When the rising edge of the data strobe signal DQS corresponds to the left edge LE of the data signal DQ, operation S151_6 is performed. In operation S151_6, the storage controller 110 may set or store a left edge (LE) offset. For example, the left edge (LE) offset may indicate a digital code. A data signal may be aligned by adjusting the number of delay cells to be activated based on the left edge offset.

In example embodiments, a training result value such as the left edge (LE) offset and the right edge (RE) offset may be changed based on a process, a voltage, and a temperature. For example, the training result value may be changed depending on a temperature. In example embodiments where a temperature increases, a delay amount of delay cells may increase; in example embodiments where a temperature decreases, a delay amount of delay cells may decrease.

Looking at operation S152 in detail, in operation S152_1, the storage controller 110 may set a right edge (RE) section. For example, the storage controller 110 may set the right edge (RE) section of the unit interval UI of the data signal DQ based on the offset information. The storage controller 110 may set the right edge section based on the right edge (RE) offset of the offset information. For example, the storage controller 110 may set, as the right edge section, a plurality of tick intervals before and after the right edge (RE) offset of the offset information. In example embodiments, the storage controller 110 may set the start point of the right edge section as a start point of a detection step.

In operation S152_2, the storage controller 110 may send the read command CMD_R and the address ADDR to the nonvolatile memory device 120. In example embodiments, the read command CMD_R may be the first set (e.g., 62h) of the read DQ training command, and the address ADDR may be a logical unit number (LUN) address, data invert information Invert mask, a first pattern, and a second pattern.

In operation S152_3, the nonvolatile memory device 120 may provide the pattern data "DATA" to the storage controller 110 in response to the read command CMD_R and the address ADDR.

In operation S152_4, the storage controller 110 may determine whether the rising edge of the data strobe signal DQS corresponds to a right edge of the data signal DQ. For example, the storage controller 110 may determine whether the pattern data "DATA" received from the nonvolatile memory device 120 are matched with reference data or the data sent to the nonvolatile memory device 120. The storage controller 110 may determine whether the rising edge of the data strobe signal DQS corresponds to the right edge of the data signal DQ, based on a determination result.

When the rising edge of the data strobe signal DQS does not correspond to the right edge of the data signal DQ, operation S152_5 is performed. In operation S152_5, the storage controller 110 may adjust a delay amount of the data strobe signal DQS. For example, the storage controller 110 may shift the data strobe signal DQS as much as the tick time. Afterwards, the storage controller 110 may repeat operation S152_2 to operation S152_4. When the rising edge of the data strobe signal DQS corresponds to the right edge RE of the data signal DQ, operation S152_6 is performed. In operation S152_6, the storage controller 110 may set or store a right edge (RE) offset. For example, the right edge (RE) offset may indicate a digital code. A data signal may be aligned by adjusting the number of delay cells to be activated based on the right edge offset.

Figure 11:
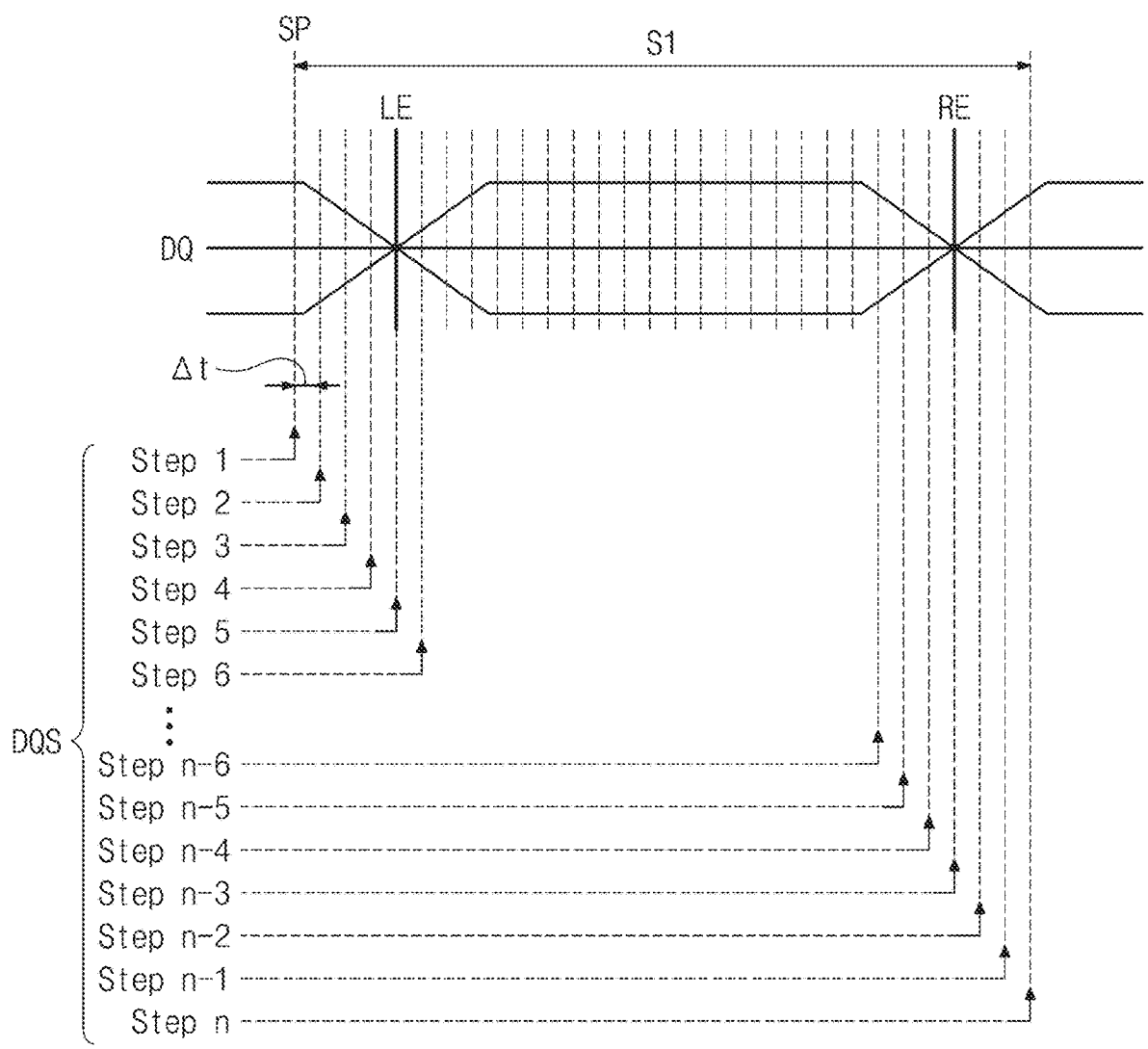
FIG. 11 is a diagram illustrating a first training method.

FIG. 11 is a diagram illustrating a first training method. Referring to FIGS. 1 and 11, the storage controller 110 may repeat the detection operation for the purpose of detecting the left edge LE (e.g., a start boundary) and the right edge RE (e.g., an end boundary) of each of the data signals DQ. For example, the storage controller 110 may perform first to n-th detection steps STEP1 to STEPn. That is the storage controller 110 may repeat the detection operation on the whole unit interval UI (e.g., a first section 51) while shifting the data strobe signal DQS as much as the tick time (Δt). In example embodiments, it is assumed the case where the left edge LE is detected in the fifth detection step STEP5. It is assumed that the right edge RE is detected in the (n−3)-th detection step STEPn−3.

The storage controller 110 may determine a start point SP for detecting the left edge LE of the data signal DQ of the data signal DQ. The start point SP may be determined with reference to a transition point of the read enable signal /RE sent from the storage controller 110 to the nonvolatile memory device 120.

After the start point SP is determined, the storage controller 110 may perform the first detection step STEP1. The storage controller 110 may send the read command CMD_R and the address ADDR to the nonvolatile memory device 120. The storage controller 110 may receive the data signal DQ and the data strobe signal DQS from the nonvolatile memory device 120.

In the first detection step STEP1, a rising edge of the data strobe signal DQS may be advanced with respect to the left edge LE of the unit interval UI as much as a plurality of tick intervals (or times) kΔt (k being a natural number). The storage controller 110 may compare pattern data provided through the data signals DQ and the given reference data. The storage controller 110 may determine whether a rising edge of the data strobe signal DQS corresponds to the left edge LE of the data signal DQ, based on a comparison result. When it is determined that the rising edge of the data strobe signal DQS does not correspond to the left edge LE of the data signal DQ, the storage controller 110 may perform a subsequent detection step, that is, the second detection step STEP2.

In the second detection step STEP2, the storage controller 110 may transmit the read command CMD_R and the address ADDR to the nonvolatile memory device 120. The storage controller 110 may receive the data signal DQ and the data strobe signal DQS. The storage controller 110 may shift the data strobe signal DQS as much as the tick time. For example, the storage controller 110 may delay the data strobe signal DQS as much as the tick time by adjusting the number of delay cells to be activated. That is, the data strobe signal DQS of the second detection step STEP2 may transition after the tick interval from the start point SP.

The storage controller 110 may compare pattern data provided through the data signals DQ and the given reference data to determine whether the rising edge of the data strobe signal DQS corresponds to the left edge LE of the data signal DQ. When it is determined in the second detection step STEP2 that the rising edge of the data strobe signal DQS does not correspond to the left edge LE of the data signal DQ, the storage controller 110 may perform a subsequent detection step, that is, the third detection step STEP3.

In the third detection step STEP3, the storage controller 110 may shift the data strobe signal DQS as much as a time corresponding to two times the tick time. That is, the data strobe signal DQS of the third detection step STEP3 may transition after two tick intervals from the start point SP. Operations of the remaining detection steps may be performed to be similar to the operation of the second detection step STEP2. Thus, additional description will be omitted to avoid redundancy. As described above, the storage controller 110 may perform the remaining detection steps STEP4 to STEPn while adjusting a delay amount of the data strobe signal DQS. Thus, additional description will be omitted to avoid redundancy.

In the fifth detection step STEP5, the storage controller 110 may compare pattern data provided through the data signals DQ and the given reference data to determine that the rising edge of the data strobe signal DQS corresponds to the left edge LE of the data signal DQ. For example, the storage controller 110 may set a time corresponding to four times the tick time as a left edge offset.

In the (n−3)-th detection step STEPn−3, the storage controller 110 may compare pattern data provided through the data signals DQ and the given reference data to determine that the falling edge of the data strobe signal DQS corresponds to the right edge RE of the data signal DQ. For example, the storage controller 110 may set a time corresponding to (n−4) times the tick time as a right edge offset.

Figure 12:
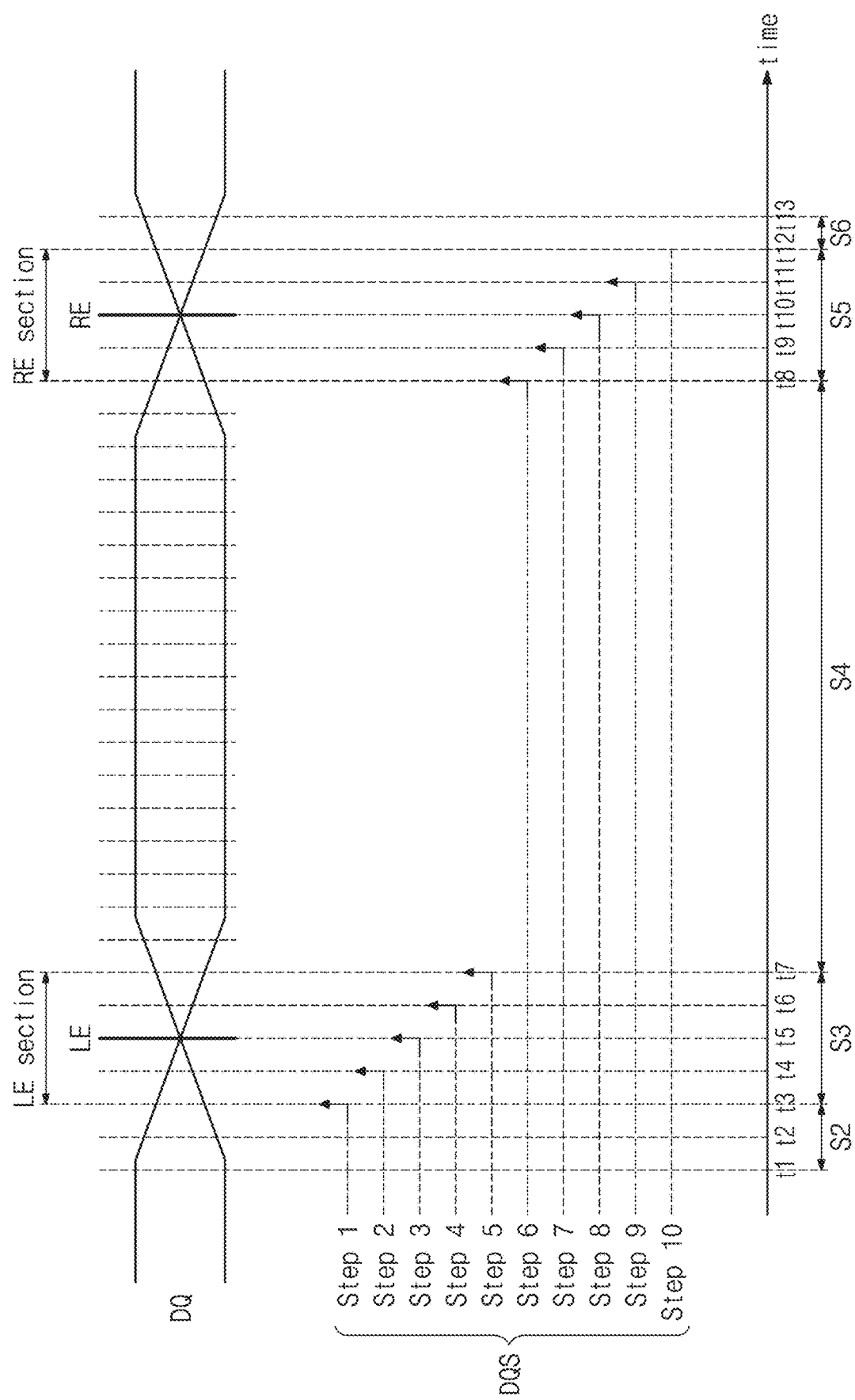
FIG. 12 is a diagram illustrating a second training operation according to example embodiments of the present disclosure.

FIG. 12 is a diagram illustrating a second training operation according to example embodiments of the present disclosure. Referring to FIGS. 1 and 12, the storage controller 110 may perform the second training operation based on offset information generated based on a first training result. The storage controller 110 may perform the detection operation only on a left edge section and a right edge section without performing the detection operation on the whole unit interval UI. That is, the storage controller 110 may detect the left edge LE while shifting the data strobe signal DQS as much as a tick time within the left edge section LE section. The storage controller 110 may detect the right edge RE while shifting the data strobe signal DQS as much as a tick time within the right edge section RE section.

In example embodiments, the storage controller 110 may set the left edge section LE section and the right edge section RE section based on offset information. The storage controller 110 may set the left edge section LE section based on a left edge offset of the offset information and may set the right edge section RE section based on a right edge offset of the offset information.

In example embodiments, to provide a margin, the storage controller 110 may set, as the left edge section, a plurality of tick intervals before and after the left edge (LE) offset of the offset information. For example, the storage controller 110 may set, as the left edge section, two tick intervals before the left edge offset and two tick intervals after the left edge offset. That is, the fifth time t5 may correspond to the left edge offset of the data signal DQ. The third time t3 may be advanced with respect to the fifth time t5 as much as a time corresponding to two times the tick time, and the seventh time t7 may be delayed with respect to the fifth time t5 as much as a time corresponding to two times the tick time. A third section S3 may correspond to the left edge section.

The storage controller 110 may set, as the right edge section, a plurality of tick intervals before and after the right edge offset. For example, the tenth time t10 may correspond to the right edge offset of the data signal DQ. The eighth time t8 may be advanced with respect to the tenth time t10 as much as a time corresponding to two times the tick time, and the twelfth time t12 may be delayed with respect to the tenth time t10 as much as a time corresponding to two times the tick time. A fifth section S5 may correspond to the right edge section.

In example embodiments, the storage controller 110 may not perform detection steps on a second section S2, a fourth section S4, and a sixth section S6. As such, the number of times of detection step may decrease, and thus, a training time may be reduced.

The storage controller 110 may perform detection steps on the left edge section of data signal DQ. For example, the storage controller 110 may perform the first to fifth detection steps STEP1 to STEP5. In example embodiments, it is assumed the case where the left edge LE is detected in the third detection step STEP3.

The storage controller 110 may perform detection steps on the right edge section of data signal DQ. For example, the storage controller 110 may perform the sixth to tenth detection steps STEP6 to STEP10. In example embodiments, it is assumed the case where the right edge RE is detected in the eighth detection step STEP8.

A way to perform the first to tenth detection steps STEP1 to STEP10 is similar to the way to perform the detection steps STEP1 to STEP*n*, which is described with reference to FIG. 11, and thus, additional description will be omitted to avoid redundancy.

Figure 13:
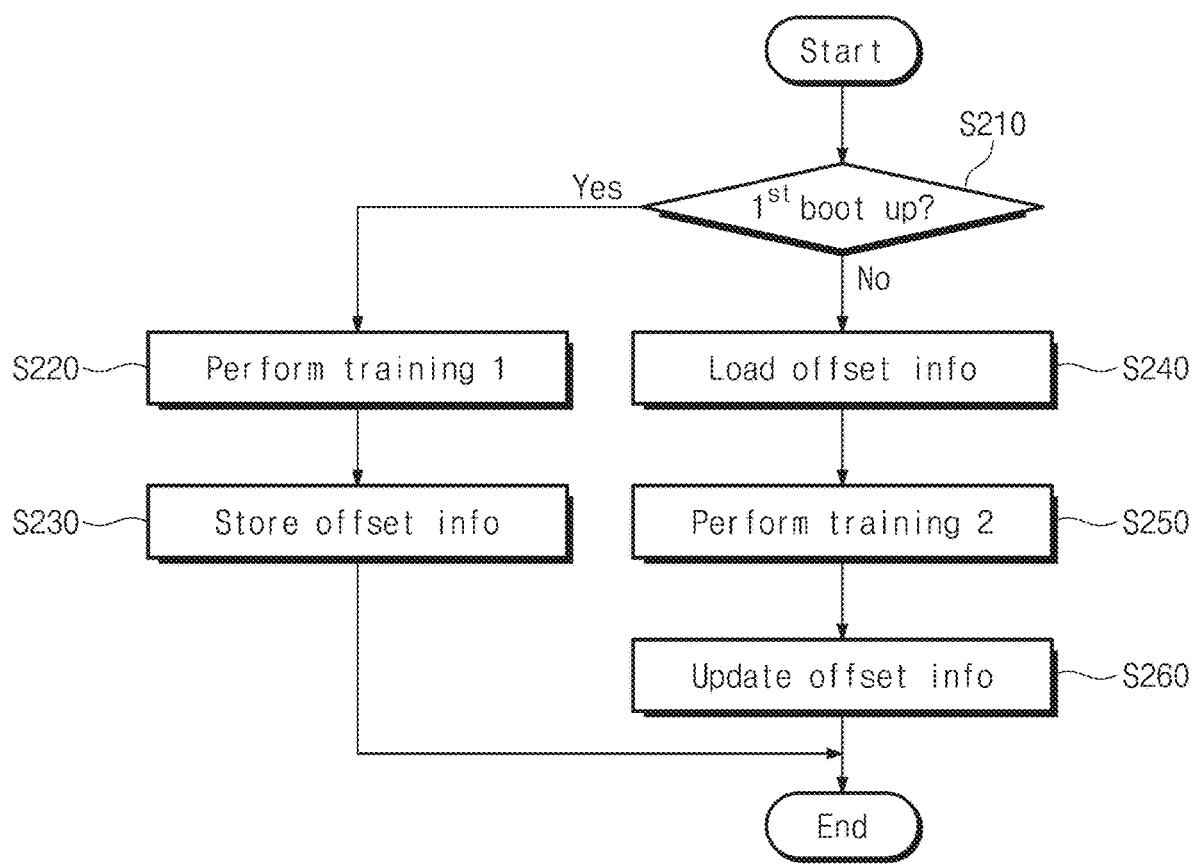
FIG. 13 is a flowchart illustrating an operation of a storage controller of FIG. 1.

FIG. 13 is a flowchart illustrating an operation of a storage controller of FIG. 1. Referring to FIGS. 1 and 13, in operation S210, the storage controller 110 may determine whether a current boot-up operation is the first boot-up operation. When it is determined that the current boot-up operation is the first boot-up operation, operation S220 is performed; when it is determined that the current boot-up operation is not the first boot-up operation, operation S240 is performed.

In operation S220, the storage controller 110 may perform the first training operation. In operation S230, the storage controller 110 may store a result of the first training operation in a memory as offset information. In operation S240, the storage controller 110 may load the offset information from the memory. In operation S250, the storage controller 110 may perform the second training operation based on the loaded offset information. Operation S210 to operation S240 are described with reference to FIG. 9, and thus, additional description will be omitted to avoid redundancy.

In example embodiments, in operation S250, the second training operation may be performed based on offset information that is made up for based on a temperature. As described with reference to FIG. 10, in example embodiments where a temperature increases, a delay amount of delay cells may increase; in example embodiments where a temperature decreases, a delay amount of delay cells may decrease.

It is assumed that a current temperature is a first temperature when the first training operation is performed or a previous second training operation is performed and is a second temperature when a current second training operation is performed. In example embodiments where the first temperature and the second temperature are the same, the storage controller 110 may perform the second training operation by using offset information without compensation. However, in example embodiments where the first temperature and the second temperature are different, the storage controller 110 may perform the second training operation by using compensated offset information.

When the second temperature is higher than the first temperature, the offset information may be made up for such that values of the offset information decrease; when the second temperature is lower than the first temperature, the offset information may be made up for such that values of the offset information increase.

In operation S260, the storage controller 110 may update the offset information based on a second training result. For example, the storage controller 110 may update left edge offsets and right edge offsets, which are detected as a result of performing the second training operation, as new offset information. The offset information updated based on the second training result may be stored in the memory as new offset information. The updated offset information may be stored in an electronic fuse (eFuse), an EEPROM, a mask ROM, a serial PROM, a flash memory, a one-time programmable (OTP) memory, or a serial NOR flash memory.

In the second training operation, the storage controller 110 of FIG. 9 may use offset information generated as a first training result. On the other hand, in the second training operation, the storage controller 110 of FIG. 13 may use offset information generated based on the first training result or the second training result.

Figure 14:
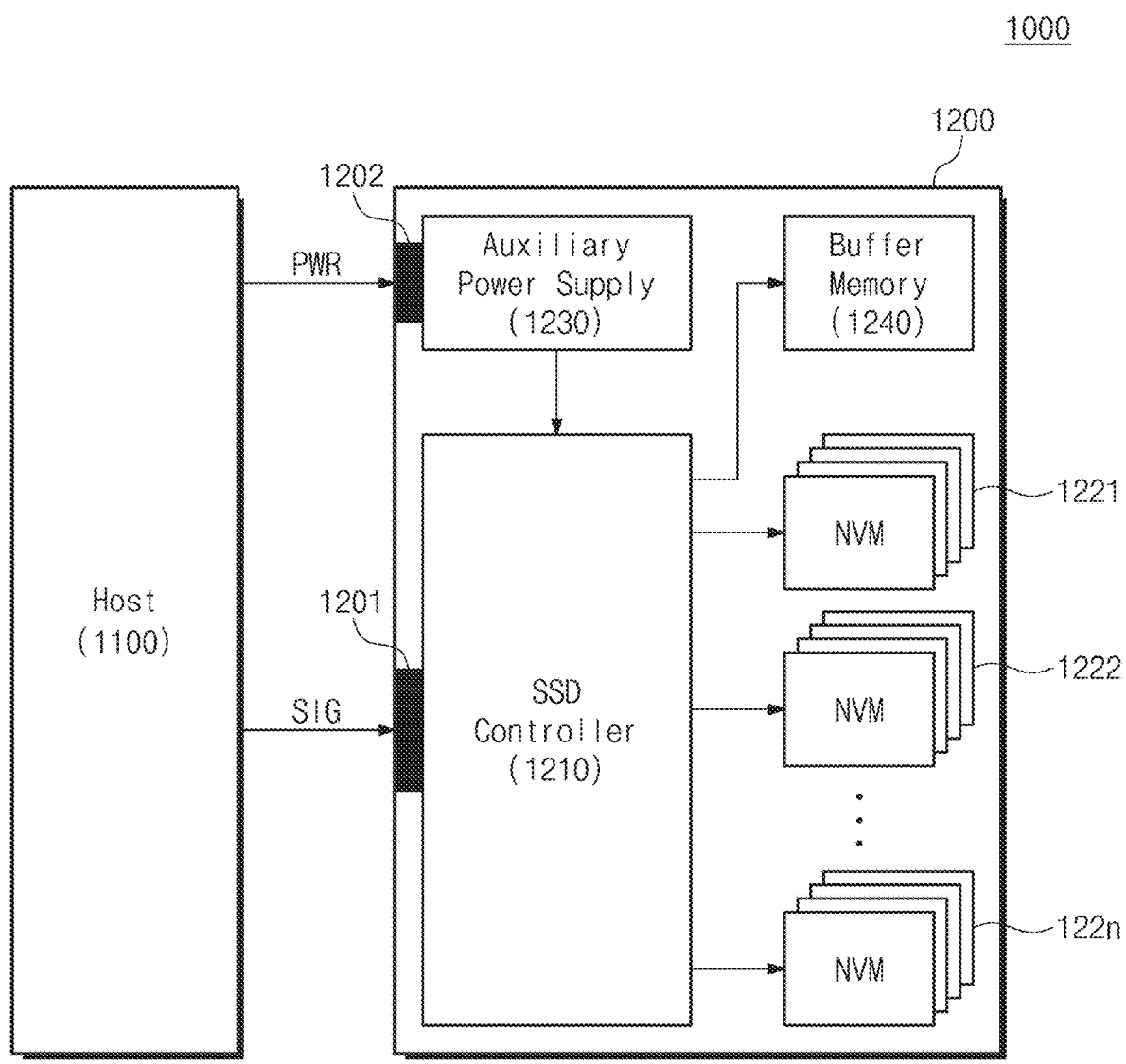
FIG. 14 is a block diagram illustrating a solid state drive (SSD) system to which a storage device according to example embodiments of the present disclosure is applied.

FIG. 14 is a block diagram illustrating a solid state drive (SSD) system to which a storage device according to example embodiments of the present disclosure is applied. Referring to FIG. 14, an SSD system 1000 may include a host 1100 and an SSD 1200.

The SSD 1200 exchanges signals SIG with the host 1100 through a signal connector 1201 and is supplied with a power PWR through a power connector 1202. In example embodiments, the signal connector 1201 may include a PCIe port, the signals SIG may be signals defined in the NVMe protocol, and the SSD 1200 may include an NVMe-based storage device. The SSD 1200 includes an SSD controller 1210, a plurality of flash memories 1221 to 122*n*, an auxiliary power supply 1230, and a buffer memory 1240. In example embodiments, each of the plurality of flash memories 1221 to 122*n* may be implemented with a separate die or a separate chip.

The SSD controller 1210 may control the plurality of flash memories 1221 to 122*n* in response to the signals SIG received from the host 1100. In example embodiments, the SSD controller 1210 may operate based on the operation method described with reference to FIGS. 1 to 13. The plurality of flash memories 1221 to 122*n* may operate under control of the SSD controller 1210. The auxiliary power supply 1230 is connected with the host 1100 through the power connector 1202. The auxiliary power supply 1230 may be charged by the power PWR from the host 1100.

When the power PWR is not smoothly supplied from the host 1100, the auxiliary power supply 1230 may power the SSD 1200.

According to example embodiments of the present disclosure, full training is performed on a nonvolatile memory device at first boot-up, and then, part or fast training is performed by using offset information of the first boot-up at second boot-up. Accordingly, a storage controller having an improved training speed, a storage device, and an operation method of the storage device are provided.

While the present disclosure has been described with reference to example embodiments thereof, it will be apparent to those of ordinary skill in the art that various changes and modifications may be made thereto without departing from the spirit and scope of the present disclosure as set forth in the following claims.

What is claimed is:

1. An operation method of a storage device which includes a storage controller circuit and a nonvolatile memory device, the method comprising:
    performing a first boot-up operation;
    performing first training on a plurality of data signals such that a detection operation of the first training is repeatedly performed on windows of the data signals;
    storing offset information generated based on a result of the first training;
    performing a normal operation based on the result of the first training;
    performing a second boot-up operation;
    performing second training on the plurality of data signals based on the offset information generated in the first training such that a detection operation of the second training is repeatedly performed on a left edge section and a right edge section of the windows of the data signals; and
    performing the normal operation based on a result of the second training,
    wherein the detection operation of the first training includes:
        sending, by the storage controller circuit, a read command and an address to the nonvolatile memory device through the plurality of data signals;
        receiving, by the storage controller circuit, pattern data from the nonvolatile memory device through the plurality of data signals and a data strobe signal synchronized with the plurality of data signals; and
        when the pattern data are not matched with given reference data, adjusting, by the storage controller circuit, a delay amount of the data strobe signal.

2. The method of claim 1, further comprising:
    loading the offset information before the second training is performed.

3. The method of claim 1, further comprising:
    updating the offset information based on the result of the second training after the second training is performed.

4. The method of claim 1, wherein the performing of the second training on the plurality of data signals comprises:
    Repeatedly performing, by the storage controller circuit, the detection operation of the second training to detect a left edge (LE) of each of the plurality of data signals;
    Repeatedly performing, by the storage controller circuit, the detection operation of the second training to detect a right edge (RE) of each of the plurality of data signals; and
    detecting a window of a data signal based on the LE and the RE.

5. The method of claim 4, wherein the repeatedly performing the detection operation of the second training to detect the LE by the storage controller circuit comprises:
    setting a left edge section based on LE offsets of the offset information;
    performing the detection operation on the left edge section; and
    when the pattern data are matched with the given reference data, setting a final LE offset.

6. The method of claim 1, wherein the offset information includes a left edge (LE) offset and a right edge (RE) offset associated with each of the plurality of data signals.

7. The method of claim 1, further comprising:
    aligning, by the storage controller circuit, the data signals and the data strobe signal based on the offset information.

8. A storage device comprising:
    a nonvolatile memory device; and
    a storage controller circuit connected with the nonvolatile memory device through a plurality of data signals,
    wherein, the storage controller circuit is configured such that, based on performing a first boot-up operation, the storage controller circuit performs first training on the plurality of data signals and generates offset information based on a result of the first training,
    wherein, the storage controller circuit is further configured such that, based on performing a second boot-up operation, the storage controller circuit performs second training on the plurality of data signals within a left edge section and a right edge section of windows of the data signals, based on the offset information, and
    wherein the first boot-up operation is a boot-up operation performed for a first time, and the second boot-up operation is a boot-up operation performed after the first boot-up operation.

9. The storage device of claim 8,
    wherein the storage controller circuit is further configured such that, in the first training, the storage controller circuit detects a left edge (LE) of each of the plurality of data signals and a right edge (RE) of each of the plurality of data signals while shifting a data strobe signal as much as a tick time during the windows of the data signals, and
    wherein the storage controller circuit is further configured such that, in the second training, the storage controller circuit sets a left edge (LE) section and a right edge (RE) section of the windows of the data signals based on the offset information, detects the LE of each of the plurality of data signals while shifting the data strobe signal as much as the tick time within the LE section, and detects the RE of each of the plurality of data signals while shifting the data strobe signal as much as the tick time within the RE section.

10. The storage device of claim 8, wherein the storage controller circuit is further configured to,
    store the offset information after performing the first training, and
    load the offset information when performing the second training.

11. The storage device of claim 8, wherein the storage controller circuit is further configured such that, based on performing the first training and the second training, the storage controller circuit,
    sends a read command to the nonvolatile memory device through the plurality of data signals during a command output phase;

sends an address to the nonvolatile memory device through the plurality of data signals during an address output phase; and receives pattern data from the nonvolatile memory device through the plurality of data signals during a data input phase.

12. The storage device of claim 9, wherein the storage controller circuit is further configured to calculate a center of a window of each of the plurality of data signals based on the detected LE and the detected RE of each of the plurality of data signals.

13. The storage device of claim 9, wherein the storage controller circuit comprises:
a data strobe pad configured to receive the data strobe signal from the nonvolatile memory device; and
a delay locked loop circuit configured to shift the data strobe signal provided from the data strobe pad as much as the tick time.

14. The storage device of claim 13, wherein the storage controller circuit further includes:
a plurality of data input/output pads configured to receive the plurality of data signals; and
a plurality of input delay circuits configured to delay the data signals provided from the input/output pads based on the offset information.

15. The storage device of claim 8, wherein the storage controller circuit is further configured to update the offset information based on a result of performing the second training.

16. A storage controller circuit comprising:
a plurality of data input/output pads configured to receive a plurality of data signals;
a data strobe pad configured to receive a data strobe signal; and
a training circuit,
wherein the training circuit is configured such that, based on performance of a first boot-up operation, the training circuit performs first training on the plurality of data signals and generates offset information based on a result of the first training,
wherein the training circuit is further configured such that, based on performance of a second boot-up operation, the training circuit performs second training on the plurality of data signals within a left edge section and a right edge section of windows of the data signals based on the offset information, and wherein the first boot-up operation is a boot-up operation performed for first time, and the second boot-up operations is a boot-up operation performed after the first boot-up operation.

17. The storage controller circuit of claim 16, wherein the training circuit is configured to store the offset information in one of a serial NOR flash memory, an electronic fuse (eFuse), an electrically erasable and programmable read only memory (EEPROM), a mask ROM, a serial programmable ROM (PROM), a flash memory or a one-time programmable (OTP) memory.

18. The storage controller circuit of claim 16,
wherein the training circuit is further configured to detect a left edge (LE) and a right edge (RE) of each of the plurality of data signals by repeatedly performing a detection operation while adjusting a delay amount of the data strobe signal, and
wherein the training circuit is further configured to perform the detection operation by,
outputting a read command through the plurality of data signals during a command output phase,
outputting an address through the plurality of data signals during an address output phase, and
receiving pattern data through the plurality of data signals during a data input phase.

19. The storage controller circuit of claim 18, wherein the training circuit is further configured to set the left edge (LE) section and the right edge (RE) section of windows of the data signals based on the offset information, detects the LE of each of the plurality of data signals while shifting the data strobe signal as much as a tick time within the LE section, and detects the RE of each of the plurality of data signals while shifting the data strobe signal as much as the tick time within the RE section.

20. The storage controller circuit of claim 16, further comprising:
a delay locked loop circuit configured to receive the data strobe signal from the data strobe pad and to adjust a delay amount of the data strobe signal in response to a clock control signal from the training circuit; and
a plurality of input delay circuits configured to receive the plurality of data signals from the plurality of data input/output pads and to adjust delay amounts of the plurality of data signals in response to an input data control signal from the training circuit.

* * * * *